US012737518B2

(12) United States Patent
Sarar et al.

(10) Patent No.: US 12,737,518 B2
(45) Date of Patent: Sep. 15, 2026

(54) MACHINE LEARNING FOR NETLIST DESIGN

(71) Applicant: QUALCOMM Incorporated, San Diego, CA (US)

(72) Inventors: Gokce Sarar, San Diego, CA (US); Ryan Michael Carey, Nashua, NH (US); Arnav Ballani, San Diego, CA (US); Bernard Bouron, Sunnyvale, CA (US); Chandram Kotturi, San Diego, CA (US); Chin-Wei Hsu, Zhubei City (TW); Akshay Sanjay Sarode, Pune (IN); Romain Lepert, Amsterdam (NL); Michael Defferrard, Chavannes-sous-Orsonnens (CH); Onur Atan, San Diego, CA (US); Lindsey Makana Kostas, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 685 days.

(21) Appl. No.: 18/332,416

(22) Filed: Jun. 9, 2023

(65) Prior Publication Data

US 2024/0411968 A1 Dec. 12, 2024

(51) Int. Cl.
*G06F 30/327* (2020.01)

(52) U.S. Cl.
CPC .................................. *G06F 30/327* (2020.01)

(58) Field of Classification Search
USPC .......................................................... 716/100
See application file for complete search history.

(56) References Cited

U.S. PATENT DOCUMENTS

2021/0158155 A1 5/2021 Zhang et al.
2022/0065926 A1* 3/2022 Chakrabarty .. G01R 31/318364

FOREIGN PATENT DOCUMENTS

WO 2022247092 A1 12/2022

OTHER PUBLICATIONS

Wang Z., et al., "Functionality Matters in Netlist Representation Learning", 6 Pages, 2022.

(Continued)

*Primary Examiner* — Bryce M Aisaka
(74) *Attorney, Agent, or Firm* — Patterson + Sheridan, L.L.P.

(57) ABSTRACT

Certain aspects of the present disclosure provide techniques and apparatus for evaluating electronic circuit designs. A directed graph representing a netlist design for an electrical circuit is accessed, the netlist design comprising a plurality of electronic components and a plurality of connections among the plurality of electronic components. A node in the directed graph is selected, the node corresponding to a register that receives input from one or more of the plurality of electronic components in the netlist design. A subgraph is generated for the node, based on the directed graph, comprising identifying a connectivity cone ending at the first register. A functional embedding is generated for the subgraph based on a trained encoder machine learning model. A predicted performance characteristic of the netlist design is generated based at least in part on the functional embedding.

30 Claims, 11 Drawing Sheets

(56) References Cited

OTHER PUBLICATIONS

Chatterjee D., et al., “GCS: High-Performance Gate-Level Simulation with GP-GPUs,” Design, Automation & Test in Europe Conference Exhibition, 2009. Date ’09, IEEE, Piscataway, NJ, USA, Apr. 20, 2009, pp. 1332-1337, XP031669748, Section 4.2, 4.3, 6 Pages, The Whole Document.

International Search Report and Written Opinion—PCT/US2024/021518—ISA/EPO—Jul. 5, 2024.

Wang Z., et al., “Functionality Matters in Netlist Representation Learning,” Practice and Experience in Advanced Research Computing, ACMPUB27, New York, NY, USA, Jul. 10, 2022, XP059121707, pp. 61-66, Abstract, Figures 2-4, Sections 4.1, 4.2, The Whole Document.

* cited by examiner

MACHINE LEARNING FOR NETLIST DESIGN

INTRODUCTION

Aspects of the present disclosure relate to electronic circuit design.

Integrated circuits (ICs) are electronic circuits that may be designed and fabricated to form a complete processing unit, such as a central processing unit (CPU), graphics processing unit (GPU), neural processing unit (NPU), digital signal processor (DSP), application-specific integrated circuit (ASIC), system-on-a-chip (SoC), or the like. To design an integrated circuit, various software modules can be used to design various components of the integrated circuit. For example, a component of an integrated circuit may be defined as a soft macro that specifies the functionality of the component irrespective of a process by which the integrated circuit will be fabricated, or as a hard macro in which the functionality of the component is tied to a specific fabrication process.

During the design process, various tests may be performed on an integrated circuit design before the integrated circuit design is finalized and made available to a semiconductor foundry for manufacturing (also known as being "taped out"). These tests may be designed to cover various logic paths within an integrated circuit to verify that the integrated circuit, as designed, generates a correct result along some given logic path and does so according to various timing constraints defined for the integrated circuit. These tests may also cover the performance of an integrated circuit for different variations in fabrication and/or operating parameters (also known as process-voltage-temperature (PVT) test cases). Because there are a large number of tests that can be run to verify the performance of an integrated circuit design, testing integrated circuits using electronic design automation (EDA) tools may be a resource-intensive process. Further, some tests may test multiple coverpoints (also referred to as "coverage points"), and the selection and execution of these tests may result in the duplication of work, which thus may use resources that could be used to perform other tests that cover non-redundant coverage points on the integrated circuit (or at least could minimize an amount of redundancy involved in testing an integrated circuit).

BRIEF SUMMARY

Certain aspects provide a method, comprising: accessing a directed graph (DG) representing a netlist design for an electrical circuit, the netlist design comprising a plurality of electronic components and a plurality of connections among the plurality of electronic components; selecting a first node in the DG, the first node corresponding to a first register that receives input from one or more of the plurality of electronic components in the netlist design; generating a first subgraph for the first node, based on the DG, comprising identifying a connectivity cone ending at the first register; generating a first functional embedding for the first subgraph based on a trained encoder machine learning model; and generating a predicted performance characteristic of the netlist design based at least in part on the first functional embedding.

Certain aspects provide a method, comprising: accessing a directed graph (DG) representing a netlist design for an electrical circuit, the netlist design comprising a plurality of electronic components and a plurality of connections among the plurality of electronic components; selecting a first node in the DG, the first node corresponding to a first register that receives input from one or more components in the netlist design; generating a first subgraph for the first node, based on the DG, comprising identifying a connectivity cone ending at the first register; generating a second subgraph that is functionally equivalent to the first subgraph; generating a first functional embedding for the first subgraph based on an encoder machine learning model; generating a second functional embedding for the second subgraph based on the encoder machine learning model; and updating one or more parameters of the encoder machine learning model based on comparing the first and second functional embeddings.

Other aspects provide processing systems configured to perform the aforementioned methods as well as those described herein; non-transitory, computer-readable media comprising instructions that, when executed by one or more processors of a processing system, cause the processing system to perform the aforementioned methods as well as those described herein; a computer program product embodied on a computer-readable storage medium comprising code for performing the aforementioned methods as well as those further described herein; and a processing system comprising means for performing the aforementioned methods as well as those further described herein.

The following description and the related drawings set forth in detail certain illustrative features of one or more aspects.

BRIEF DESCRIPTION OF THE DRAWINGS

The appended figures depict certain features of one or more aspects of the present disclosure and are therefore not to be considered limiting of the scope of this disclosure.

To facilitate understanding, identical reference numerals have been used, where possible, to designate identical elements that are common to the drawings. It is contemplated that elements and features of one aspect may be beneficially incorporated in other aspects without further recitation.

DETAILED DESCRIPTION

Figure 1:
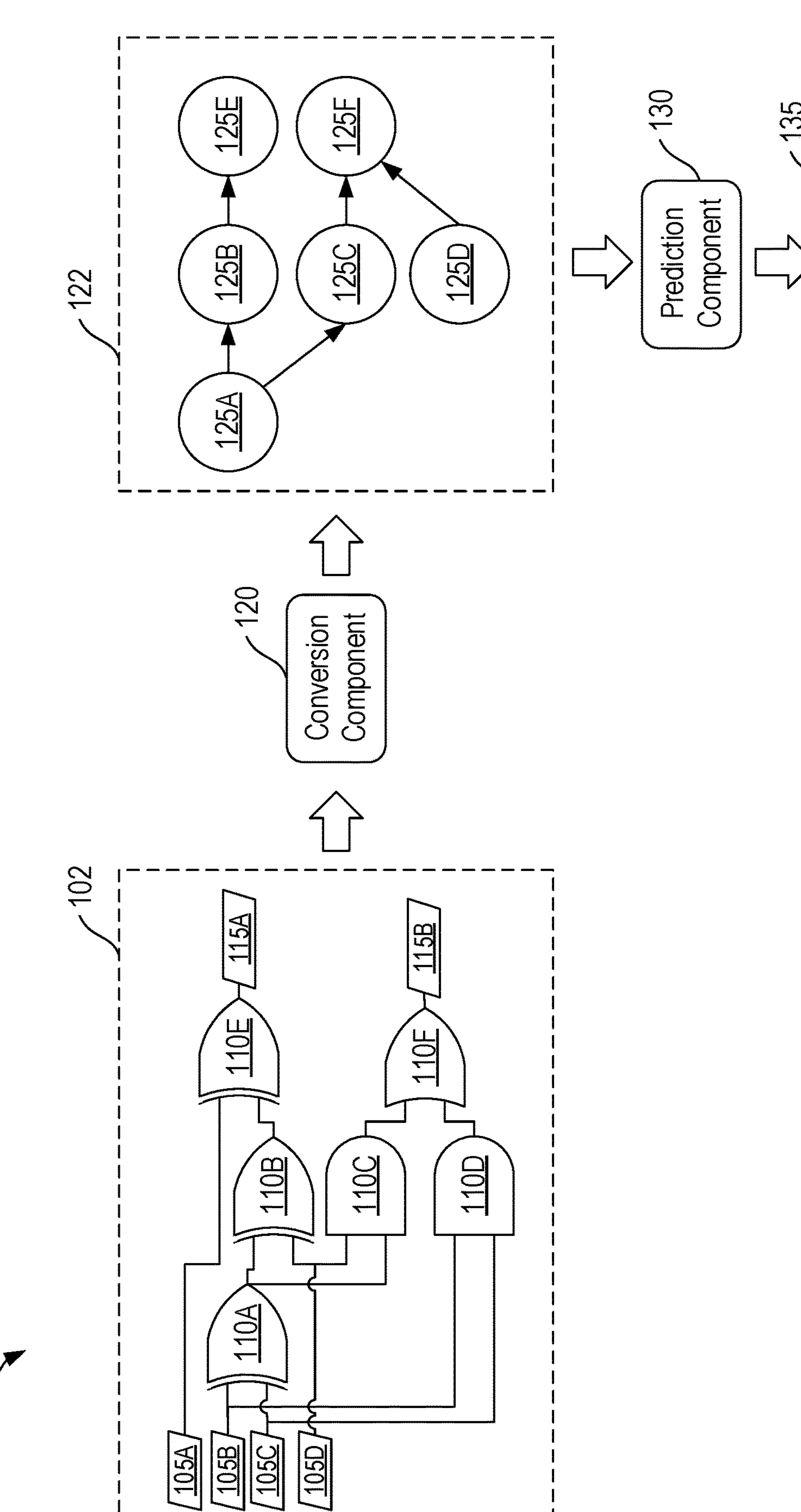
FIG. 1 illustrates an example workflow to generate graph representations of netlists and generate machine learning predictions based on graph representations.

Aspects of the present disclosure provide apparatuses, methods, processing systems, and computer-readable mediums for evaluating electronic circuit designs using machine learning techniques.

During the development process, electronic circuits may be defined in terms of individual circuits, sub-systems, and/or the full system-on-a-chip (SoC). Various test cases may be executed on simulations of these individual circuits, sub-systems, and the SoC itself (e.g., virtual circuits laid out in a design file or other construct illustrating electrical relationships (which may include spatial characteristics such as trace length maximums or stub lengths) between different components in a circuit) to ensure that the SoC and its subsystems operate as expected. For example, the simulated SoC and its subsystems may be tested to ensure that timing constraints are met so that a signal does not arrive too early or too late relative to an expected time of arrival. For circuits that fail a timing test for a given test case, the design of the simulated circuit may be redesigned and re-tested. Additionally, after smaller components are verified, larger components incorporating these smaller components may be tested against the various test cases to ensure that these larger components also meet the timing constraints. If the larger components do not meet these timing constraints, then the larger component may be redesigned to rectify the performance issues.

Testing or otherwise evaluating integrated circuit designs is generally a time-intensive process. As the number of test cases increases for a given integrated circuit design, the computing resources (processing time, memory, etc.) may similarly increase. Thus, for an integrated circuit design with a large number of test cases to be tested (e.g., corresponding to different portions of a circuit, functions to be executed on the integrated circuit, process parameters, operating voltages (corresponding to processor speed), operating temperatures, and the like), computational resources utilization for testing an integrated circuit on an individual component, subsystem, and SoC level may correspondingly increase.

Aspects of the present disclosure provide machine-learning-based techniques to learn or generate effective graph-based representations of ICs and other electronic circuits in order to perform a variety of tasks, such as to predict or evaluate a variety of performance, power, and area (PPA) metrics, for design profiling, and/or for code equivalency checks. In some aspects, techniques are described to create invariant functional embeddings in flattened netlist designs. In some aspects, the described techniques for tokenization in flattened designs can be used to extract logically equivalent functional entities to be used in contrastive learning.

In some aspects, machine learning (ML) can be used to extract performance gains in SoC or other circuit design. Representation learning for circuit design may be used in some aspects. For example, effective ML-based chip design solutions may use representation learning as an automated alternative to expert-driven custom feature engineering, to increase robustness to noise, small dataset sizes, and the like.

In some aspects of the present disclosure, the functionality of and interactions between individual gates can be captured, independent of the physical manifestations of the netlist, which improves downstream ML prediction tasks and improves subsequent design. In some aspects, equivalent functional netlist architectures can be captured, and implementation invariant functional embeddings in flattened designs can be created.

In some aspects, equivalent logic clouds (determined based on start and end registers of the cloud) can be extracted. Influence cone logic, ending at an end-register, can then be created. As used herein, an influence cone (also referred to as a cone of influence or a connectivity cone) refers to a portion of a circuit design that is capable of affecting signals of the property or of a given component in the design (e.g., an endpoint register). For example, the connectivity cone for a given register may include the preceding or upstream components that feed input to the given register, ending with the immediately preceding register on each input path. That is, the connectivity cone for a given register may correspond to the set of register-to-register paths that terminate at the given register.

As used herein, a register is a collection of flip-flops. A flip-flop is used to store single bit digital data. For storing a large number of bits, the storage capacity can be increased by grouping more than one flip-flop. As used herein, an endpoint register may be a register which is located at the end of a path. There may be multiple paths that end at one register. In some aspects, contrastive learning can then be applied to create embeddings that are invariant to synthesis implementation.

In some aspects, functional-equivalent tokenization can be performed without a priori knowledge (e.g., without labeled data). Additionally, in some aspects, skip connections (also referred to as "pseudo-edges") can be used to enable the endpoint to learn from all cells in the influence cone. This can substantially improve performance.

As discussed above, in some aspects, the learned circuit representation can be used as input to various models and processes, such as PPA metric prediction models, design profiling operations, code equivalency checks, and the like. By using aspects of the present disclosure, an effective circuit representation (e.g., embedding) can be generated which substantially improves downstream tasks, such as PPA tasks. This may enable a variety of improved outcomes, such as reduced die size, reduced compute time and/or resources, and/or shortened scheduling during IC design.

Example Workflow to Generate Graph Representations of Netlists and Generate Machine Learning Predictions Based on Graph Representations FIG. 1 illustrates an example workflow 100 to generate graph representations of netlists and generate machine learning predictions based on graph representations.

In the illustrated example, a netlist 102 including a set of components 110A-F (collectively, components 110), such as logic gates (e.g., combinational gates) and accompanying connections/circuitry (referred to in some aspects as wires) connecting the components can be processed to generate a corresponding graph representation 122. Specifically, a directed graph (DG) may be created, where each node represents a component (e.g., a logic gate or register) in the netlist 102 and each edge represents a wire or other connection between components in the netlist 102. This graph representation 122 can then be evaluated to generate prediction(s) 135 for the netlist 102.

As illustrated, the netlist 102 generally specifies or indicates the arrangement and connectivity of combinational nodes in electronic circuit such as AND gates, OR gates, NAND gates, and the like. As illustrated, the design of the netlist 102 specifies four inputs 105A-C (collectively, inputs 105) and two outputs 115A-B (collectively, outputs 115). Although not included in the illustrated example, in some aspects, the netlist 102 may include one or more registers. For example, one or more of the inputs 105 may be provided by registers (or from an upstream circuit component), and one or more of the outputs 115 may be stored into registers (or provided directly to another downstream component).

In some aspects, the particular inputs 105 and outputs 115 define the functionality of the netlist 102. In some aspects, it may be possible to construct a different netlist that is functionally equivalent to the netlist 102, where "functional equivalence" indicates that the netlists generate the same output(s) when provided with the same input(s). That is, netlists may be functionally equivalent or matching if the netlists implement the same logic or are otherwise interchangeable. Various netlist designs may have various specific performance metrics (even when the netlist designs implement identical logic), such as differences in latency, power consumption, chip area, heat dissipation, and the like. In some aspects, therefore, the functionality of the netlist 102 can be captured via a trained machine learning model, allowing various metrics to be predicted in an implementation-agnostic manner.

In the illustrated workflow 100, a conversion component 120 can convert the netlist 102 to the graph representation 122 of the netlist. In some aspects, the conversion component 120 performs this conversion by generating a graph node (also referred to as a vertex in some aspects) for each component (e.g., each logic gate or register) in the netlist 102, as well as a set of directed edges to represent each wire or connection in the netlist 102. Specifically, in the illustrated example, the graph node 125A corresponds to the component 110A, the graph node 125B corresponds to the component 110B, the graph node 125C corresponds to the component 110C, the graph node 125D corresponds to the component 110D, the graph node 125E corresponds to the component 110E, and the graph node 125F corresponds to the component 110F (where the graphs nodes 125A-F are collectively referred to herein as graph nodes 125). Although not depicted in the illustrated example, in some aspects, if the inputs 105 and/or outputs 115 correspond to registers, the conversion component 120 may similarly generate nodes for each such register (with accompanying edges).

In some aspects, the conversion component 120 can associate each edge and/or node 125 in the graph representation 122 with corresponding information about the netlist 102. For example, each node 125 may be labeled with information identifying the type of the corresponding component (e.g., indicating whether the node represents a register, an AND gate, and the like). In some aspects, other information such as timing or functionality characteristics (e.g., the time that elapses between when the component receives a stable input signal and when the component outputs a stable output signal) of each component.

In the illustrated example, the graph representation 122 can then be evaluated by a prediction component 130 to generate the one or more predictions 135. Generally, the prediction component 130 may extract or generate subgraphs from the graph representation 122 (e.g., based on register-to-register paths), optionally modify or augment these subgraphs to enhance prediction accuracy, generate functional embeddings (e.g., embeddings reflecting the logical functionality of the subgraph), and evaluate these functional embeddings to generate the prediction(s) 135 relating to all or a part of the netlist 102.

For example, as discussed above, the prediction(s) 135 may include performance predictions (e.g., latency between input being provided and output being generated by all or a portion of a circuit designed according to the netlist 102), power predictions (e.g., how much power or energy will be consumed by a circuit designed according to the netlist 102), area predictions (e.g., how much physical area, such as on a chip, will be consumed by a circuit designed according to the netlist 102), and the like. For example, in some aspects, the prediction component 130 may generate performance predictions for each subgraph. The prediction component 130 may aggregate these predictions to yield overall predictions 135 for the netlist 102.

In this way, a wide variety of netlist metrics or characteristics can be predicted, allowing for substantially improved netlist design. For example, timing characteristics of the design can be predicted and/or validated at an early stage (e.g., long before tape-out), allowing for rapid revision and redesign if indicated without consuming substantial resources to actually construct the circuit. In some aspects, therefore, the prediction(s) 135 can be used to facilitate manufacture of improved electronic circuits. As used herein, facilitating manufacture of an electronic circuit can generally include actually manufacturing the circuit, as well as providing circuit predictions that help to validate the design, thereby enabling the circuit to be constructed more efficiently (and resulting in improved circuit performance, once created).

Figure 2:
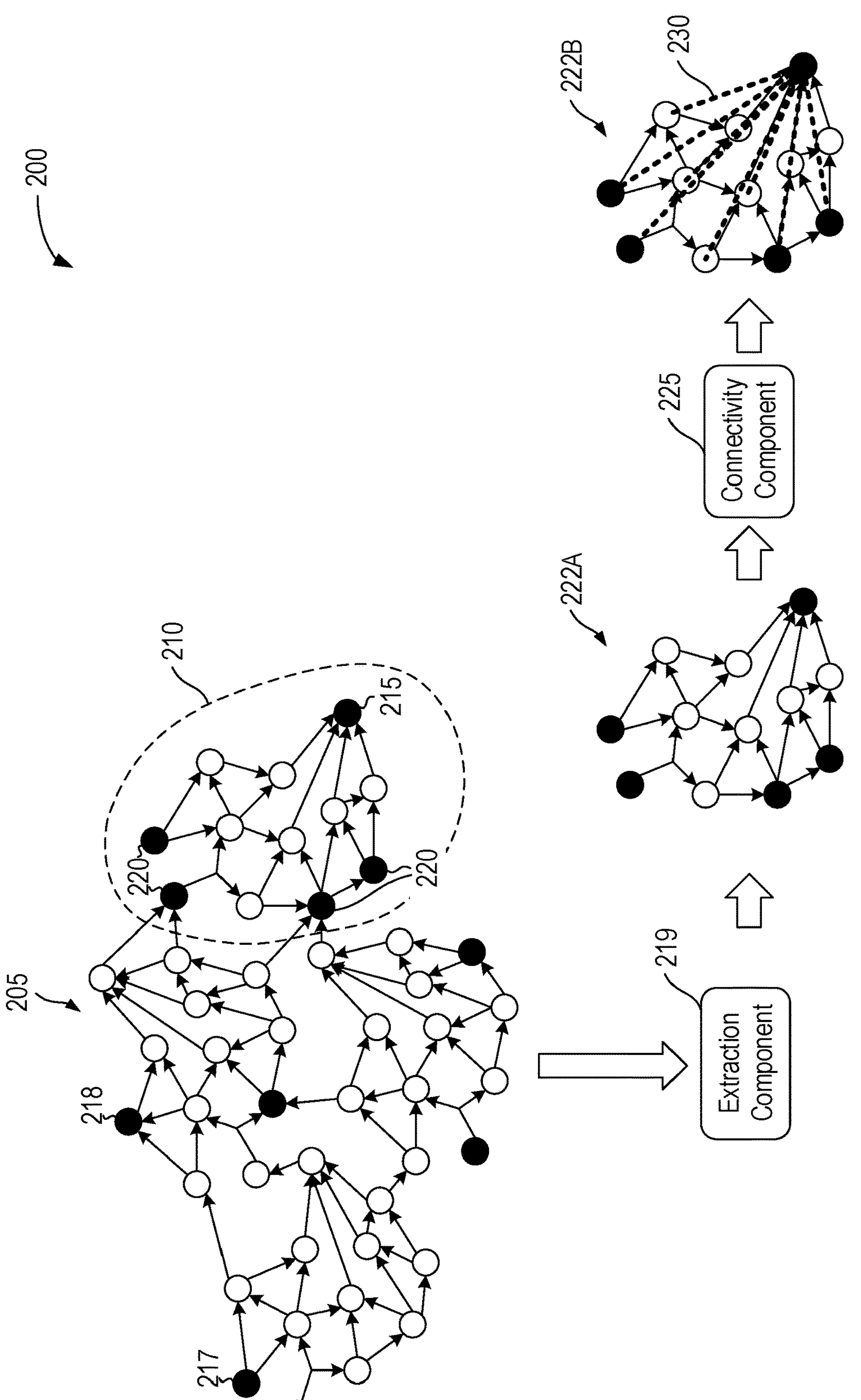
FIG. 2 illustrates an example workflow to generate directed subgraphs based on netlist directed graphs (DGs) to enable machine learning netlist predictions.

Example Workflow to Generate Directed Graphs Based on Netlist DGs to Enable Machine Learning Netlist Predictions FIG. 2 illustrates an example workflow 200 to generate directed subgraphs based on netlist DGs to enable machine learning netlist predictions.

In aspects, as discussed above, the same logic can be represented with different Boolean logic (e.g., different netlists) as manifestations of synthesis and physical implementation. As used herein, a Boolean function can be described by a logical expression (referred to in some aspects as a Boolean expression) which consists of binary variables (e.g., the constants zero and one) and logic operation symbols (e.g., AND, OR, NAND, NOR, XAND, XOR, XNOR, and the like).

As discussed above and below, in some aspects, the netlist can be represented as a set of connectivity cones (also referred to in some aspects as cones of influence (COIs) and/or influence cones) of endpoint registers, which enables the system to encapsulate consistent equivalent logic between different design stages. In some aspects, such as in the illustrated example, a graph representation (e.g., a DG or a directed acyclic graph (DAG)) for the connectivity cones starting from immediate input registers for each endpoint register can be created, and skip connections can be added from all cells or nodes in the connectivity cone to the endpoint, which enables the endpoint to learn from all cells in the influence cone.

Specifically, in the illustrated workflow 200, a netlist design can be converted to a directed graph 205, as discussed above (e.g., by conversion component 120 of FIG. 1), where each component in the netlist has a corresponding node in the graph, and each wire in the netlist has a corresponding edge in the graph. In the illustrated example, registers are denoted as black or solid nodes, and combinational cells (e.g., logic gates) are denoted as white or hollow in nodes. Additionally, in the illustrated graph 205, a dashed line 210 indicates a subgraph that will be extracted and discussed in more detail below.

As discussed above, an extraction component 219 may generate or extract a subgraph (such as subgraph 222A), also referred to as a DG and/or a DAG in some aspects, based on register-to-register pathways in the graph 205. In some aspects, the subgraphs 222 are acyclic (e.g., they are DAGs). In some aspects, the subgraphs 222 are directed (e.g., they are DGs), but need not necessarily be acyclic. In some aspects, the extraction component 219 may perform subgraph extraction for each register in the netlist that receives input from one or more other components in the netlist. That is, any node corresponding to registers that receive input from other component(s) in the netlist (such as node 215, some of nodes 220, node 218, and the like) may be used to generate a corresponding subgraph or DG based on its corresponding connectivity cone. In some aspects, the extraction component 219 may not select or process any nodes corresponding to registers that do not receive input from any other component in the netlist (e.g., node 217, which reflects an input register to the netlist), as these nodes have no connectivity cones in the netlist.

For example, in the illustrated workflow 200, the extraction component 219 may select the node 215 (representing a register) to generate the subgraph 222A. In the illustrated example, the extraction component 219 may traverse each input edge (each edge ending at the selected node 215) backwards in the directed graph 205 until a set of registers is identified. That is, if a given edge begins at a combinational node, the extraction component 219 may continue to traverse the edges backwards from the combinational node. If a given edge begins at a register node, the extraction component 219 may determine that this register acts as an input node to the subgraph, and refrain from further backwards traversal beyond the input register (though other paths may continue further backward in the graph 205).

In the illustrated example, for the node 215, the extraction component 219 may identify that the nodes 220 act as the input registers for the subgraph 222A. For example, if the nodes 220 were removed from the graph 205, node 215 (and its connectivity cone) would be completely disconnected from the rest of the graph 205. In this way, the subgraph 222A represents a DG that forms a discrete logical portion of the graph 205. Similarly, when selecting the node 218 for evaluation, the extraction component 219 will determine that the node 217 is an input register for the connectivity cone of the node 218 (by traversing the edges backwards until all paths have reached one or more registers).

Stated differently, the extraction component 219 may identify all of the register-to-register pathgroups that end at the selected endpoint register (and begin at an upstream register). That is, as illustrated, the extraction component 219 selects the node 215 register as the "endpoint" and traverses the edges backwards until a set of input registers (reflected by nodes 220) are identified (e.g., until all inputs to the endpoint register are found). In this way, the system creates or extracts a DG for the selected endpoint.

As illustrated, these endpoint registers generally correspond to nodes that receive input from one or more upstream components in the graph/netlist, but which may themselves also be a source of data to a downstream component in the graph.

In the illustrated workflow, a connectivity component 225 may optionally be used to add pseudo-edges 230 (denoted using dashed lines in subgraph 222B). These pseudo-edges 230 may be added to connect each cell or node in the subgraph 222A (the extracted DG) to the selected endpoint register. That is, in some aspects, the pseudo-edges 230 can be added for each node that is originally not directly connected to the endpoint. These pseudo-edges can improve or provide invariance in some aspects. For example, the input registers may be connected indirectly (via one or more combinational nodes) to the output register, and the connectivity component 225 may add a respective pseudo-edge from each input register to the output register in the subgraph 222B. These pseudo-edges can allow the models to more efficiently and accurately learn from upstream components that are only indirectly connected to the endpoint.

In some aspects, the extraction component 219 and/or the connectivity component 225 may evaluate each register endpoint and/or subgraph 222 until the entire graph 205 has been processed (e.g., until all registers have been evaluated), resulting in a set of subgraphs 222 (referred to as DGs, DAGs, COIs, or connectivity cones in some aspects, as discussed above). As discussed above, each subgraph 222 generally corresponds to an endpoint register, one or more input registers, and one or more combinational components (as well as corresponding edges). Each subgraph 222 thereby represents a portion of the original netlist. According to various aspects, each subgraph 222 can be evaluated as discussed below to generate effective and invariant embeddings.

Figure 3:
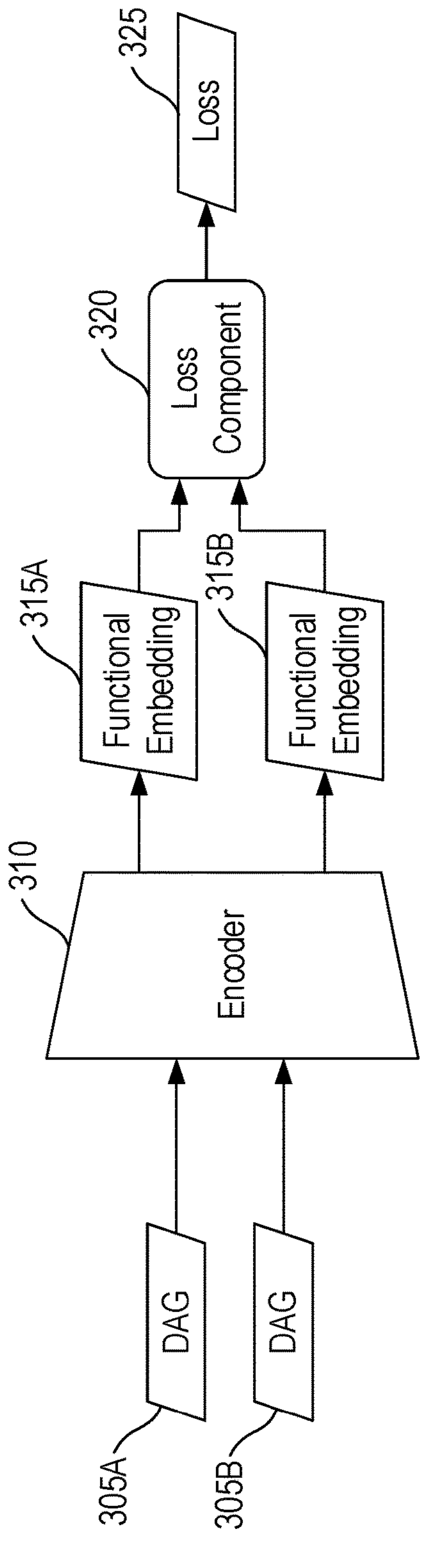
FIG. 3 depicts an example workflow for training an encoder machine learning model to generate functional embeddings for netlists.

Example Workflow Training an Encoder Machine Learning Model to Generate Functional Embeddings for Netlists FIG. 3 depicts an example workflow 300 for training an encoder machine learning model to generate functional embeddings for netlists.

In some aspects, contrastive learning can be used to learn to generate effective invariant graph embeddings that can be used for a wide variety of downstream tasks. In some aspects, contrastive learning may correspond to a representation technique to learn an embedding space, where similar or matching pairs of inputs are embedded closer together in the space and different pairs of inputs are pushed away from each other in the space.

In the illustrated example, the input during training comprises a set of influence or connectivity cones of endpoint registers, depicted as DAGs 305A and 305B (collectively, DAGs 305). For example, the DAGs 305 may be generated using the workflow 200 above to generate subgraphs based on netlists, where each DAG 305 includes or reflects the set of incoming paths for a given endpoint register, starting from the immediately preceding registers in the netlist. That is, each DAG 305 may correspond to a subgraph 222 from FIG. 2. Although the illustrated example depicts DAGs 305, as discussed above, in some aspects the subgraphs may be DGs (which may or may not by acyclic). In some aspects, the DAGs 305 include pseudo-edges (e.g., the DAGs 305 correspond to the subgraph 222B of FIG. 2). In other aspects, at least some of the DAGs 305 do not include such pseudo-edges (e.g., the DAGs 305 correspond to the subgraph 222A of FIG. 2).

In some aspects, pairs of DAGs 305 are used as input or training samples, where positive samples correspond to netlist portions (e.g., DAGs) which carry identical logical signals (and thus should be represented identically), and negative samples are the remaining sets (e.g., DAGs that implement different logic). That is, DAGs having equivalent functionality should result in equivalent (or similar) embeddings, while DAGs having non-equivalent functionality should result in substantially different embeddings.

In the illustrated example, an encoder 310 (referred to in some aspects as an encoder machine learning model, an encoder model, or simply a machine learning model) evaluates input DAGs 305 to generate corresponding functional embeddings 315. Specifically, the encoder 310 generates functional embedding 315A based on DAG 305A, and functional embedding 315B based on DAG 305B. Although the illustrated example suggests processing two (or more) DAGs 305 in parallel, in some aspects, the encoder 310 may process DAGs 305 independently (e.g., sequentially) to generate the functional embeddings 315.

In some aspects, the encoder 310 may generally use a wide variety of machine learning architectures. For example, the encoder 310 may be implemented using graph neural networks (GNNs), graph attention networks (GATs), graph transformers, and the like.

Generally, the functional embeddings 315 represent embeddings (e.g., vectors or tensors) that represent or reflect the functionality of the corresponding input DAG 305. As discussed above, when training the encoder 310, a positive sample may include two or more DAGs 305 having the same functionality (e.g., corresponding to the same endpoint register at two or more different design stages for the netlist). In some aspects, given a DAG 305, the system can generate functionally equivalent DAGs, such as using synthesis tools that are configured to rearrange or modify netlist designs to generate equivalent netlists that may have reduced latency, decreased power consumption, and/or the like. That is, the system may automatically generate positive exemplars using existing netlist synthesis tools to generate functionally equivalent DAGs for each input DAG 305.

In some aspects, in-batch negative samples can optionally be used as well. For example, when training based on a given batch of DAGs 305, the system may generate negative exemplars by comparing each DAG with one or more other DAGs (in the batch) having non-equivalent functionality.

In the illustrated workflow 300, the functional embeddings 315 from a training sample (which may be a positive sample or a negative sample) are provided to a loss component 320, which generates a loss 325 for the pair. For example, as discussed above, functionally equivalent DAGs should result in similar functional embeddings 315 (e.g., with a small cosine distance), while non-functionally equivalent DAGs should result in different functional embeddings 315 (e.g., with a large cosine distance). In some aspects, that is, cosine similarity can be used as the similarity metric to compare functional embeddings. In some aspects, stochastic and/or batch optimization can be performed to update the parameters of the encoder 310. Although comparison of a pair of functional embeddings 315 is depicted for conceptual clarity, in some aspects, the loss component 320 may additionally or alternatively compare three or more embeddings to generate the loss 325 (e.g., generating one loss value based on three or more embeddings, or generating multiple pair-wise loss values).

In some aspects, the encoder 310 is trained only on positive exemplars. For example, the loss component 320 may use one or more regularization terms to cause functional embeddings 315 of non-equivalent DAGs 305 to diverge. In some aspects, the encoder 310 may additionally or alternatively be trained using both positive and negative examples.

In some aspects, the loss for a pair of positive samples (e.g., DAGs 305 having matching functionality) is defined using a normalized temperature-scaled cross entropy loss (NT-Xent), such as defined by Equation 1 below, where $\ell_{i,j}$ is the loss for positive samples (DAGs i and j with matching functionality), log (•) is a log function, exp(•) is an exponent function, sim(•) is a similarity function (e.g., cosine similarity), $z_i$ and $z_j$ are the functional embeddings 315 which are created by the encoder, $\tau$ is the temperature term, $\mathbb{1}_{[k \neq i]}$ is the indicator function which is generally equal to 1 but has a value of 0 when k=i (e.g., when the similarity is calculated for the same sample itself in the batch).

$$\ell_{i,j} = -\log\left(\frac{\exp\left(sim(z_i, z_j)/\tau\right)}{\sum_{k=1}^{N} \mathbb{1}_{[k \neq i]} \exp\left(sim(z_i, z_k)/\tau\right)}\right) \tag{1}$$

In some aspects, the mean of the losses for all positive pairs in the training batch can be defined using Equation 2 below, where $\mathcal{L}$ is the loss, and N is the number of samples from a first DG in the batch (e.g., where a batch has 2N total samples: N from the DG, and N equivalent samples), $$\mathcal{L} = \frac{1}{2N}\sum_{k=1}^{N}[\ell(2k-1, 2k) + \ell(2k, 2k-1)] \tag{2}$$

In some aspects, the loss 325 can then be used to refine or update one or more parameters of the encoder 310, such as via backpropagation. This allows the encoder 310 to learn to generate functional embeddings 315 that accurately reflect the functionality of input DAGs 305. That is, using contrastive learning, the encoder 310 learns to generate effective and reliable DAG embeddings that reflect the functionality of the subgraphs or DAGs themselves, rather than simply reflecting the specific arrangement of components. This substantially improves the usefulness of the functional embeddings 315 for downstream tasks.

Figure 4:
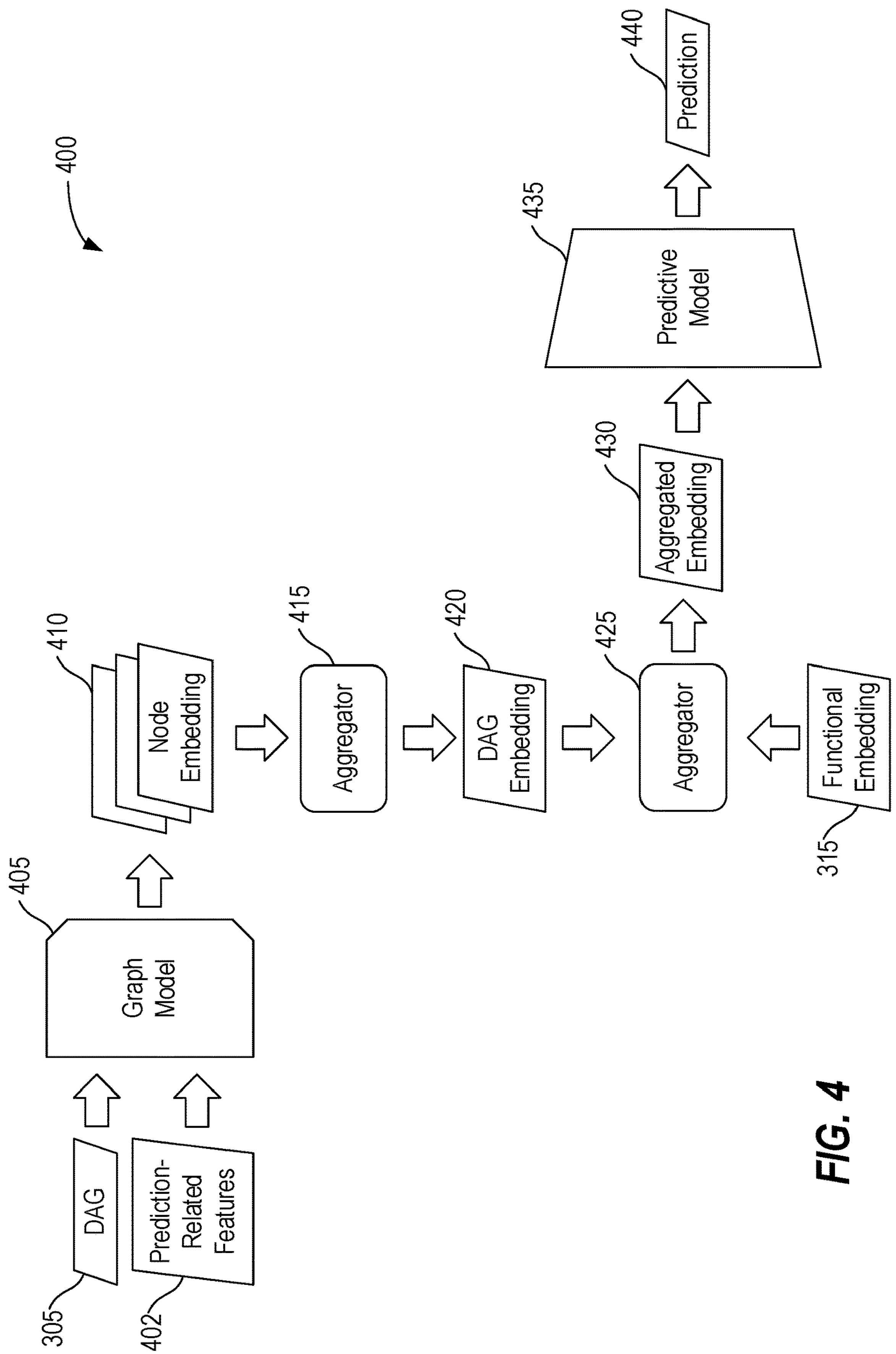
FIG. 4 depicts an example workflow for generating machine learning predictions based on functional netlist embeddings.

Example Generating Machine Learning Predictions Based on Functional Netlist Embeddings FIG. 4 depicts an example workflow 400 for generating machine learning predictions based on functional netlist embeddings. Specifically, the workflow 400 depicts one example use of machine learning to generate predictions of the performance of a netlist based on DAG embeddings, as discussed above.

For example, the depicted workflow 400 may be used to generate timing predictions (where the design prediction indicates the predicted timing of the electronic circuit). As discussed above, the robust netlist representations (generated using an encoder such as the encoder 310 of FIG. 3) can be used for a variety of downstream PPA metric predictions (which are informative of the quality of the circuit design). Timing prediction is one such use case where the more effective netlist representations described herein can bring significant benefits.

As discussed above, in a chip design, data flow is governed by the system clocks. In a given clock period, data should travel from start point to endpoint, where these points can be registers, memory, inputs/outputs (I/Os), and the like. Register-to-register paths are used as examples herein. If data cannot travel, in a given clock period, from a start register to an end register (or if data travels too fast before the end-register becomes available), timing violations may occur. Generally, knowing if any timing violations will occur as early as possible in the design process (e.g., before tape-out) is tremendously beneficial.

In some conventional systems, timing predictions are generated at the end of placement of the physical design stage. However, having these predictions earlier in the synthesis stage would save tremendous amounts of time and waste for tape-out. Although timing predictions are used as one example, aspects of the present disclosure are readily applicable to predict a wide variety of circuit metrics.

In the illustrated example, a DAG 305 is used as the input sample to a graph model 405 (such as a GNN, a GAT, and/or a graph transformer). As discussed above, though the illustrated example depicts DAG 305, in some aspects the input subgraph may be a DG (with or without cycles). In the illustrated example, this DAG 305 is a subgraph, such as the subgraph 222A or 222B generated using the workflow 200 of FIG. 2. In some aspects, this input may alternatively be a DAG embedding (also referred to as a DG embedding in some aspects), such as the functional embedding 315 of FIG. 3.

In some aspects, the DAG 305 includes any relevant timing-related features (or other features may be relevant for the specific prediction task). For example, each node in the DAG 305 may specify gate-level performance characteristics (e.g., the time that elapses between receiving a stable input and outputting a stable output). In other aspects, such features are reflected in prediction-related features 402. Generally, the prediction-related features may include a wide variety of information depending on the particular prediction being generated. For example, to predict timing, the prediction-related features 402 may include timing information (e.g., the time that elapses between each type of gate receiving a stable input and outputting a stable output). As another example, to predict power consumption, the prediction-related features 402 may include information such as power consumption of each component or gate.

As illustrated, the input DAG 305 and/or the prediction-related features 402 are processed by a graph model 405 (e.g., a GNN comprising one or more layers) to generate a set of node embeddings 410 (e.g., an embedding for each node in the DAG 305). In some aspects, to generate each node embedding 410, the graph model 405 may evaluate the context of each given node (e.g., its characteristics and/or the connectivity to direct and/or indirect neighboring nodes).

In the illustrated workflow 400, these node embeddings 410 are accessed by an aggregator 415 to generate a DAG embedding 420 (also referred to in some aspects as a DAG-level embedding, a subgraph embedding, and/or a DG embedding). In some aspects, the aggregator 415 may use a pooling operation to aggregate the node embeddings 410 (e.g., a minimum-pooling, maximum-pooling, average-pooling, and the like) to generate a single DAG embedding representing the DAG 305 and/or the prediction-related features 402.

As illustrated, the DAG embedding 420 can then be combined with a functional embedding 315 via an aggregator 425 to generate an aggregated embedding 430. In some aspects, the functional embedding 315 is generated by an encoder (e.g., the encoder 310 of FIG. 3) based on a subgraph (e.g., based on the DAG 305). That is, a single DAG 305 may be used to generate the DAG embedding 420 and the functional embedding 315.

In some aspects, the aggregator 425 combines the DAG embedding 420 and the functional embedding 315 using a concatenation operation (e.g., concatenating the functional embedding 315 with the DAG embedding 420). In some aspects, the aggregator 425 may use other operations, such as pooling, to combine the DAG embedding 420 and the functional embedding 315.

As illustrated, this aggregated embedding 430 is then used as input to a predictive model 435 (also referred to in some aspects as a predictive machine learning model, a metric or characteristics model, or simply a machine learning model) to generate a prediction 440 for the DAG 305. Generally, the predictive model 435 may be implemented using a variety of architectures, such as a multilayer perceptron (MLP), a neural network, and the like.

In some aspects, the predictive model 435 can be trained using supervised learning (e.g., labeled exemplars). For example, a DAG 305 may be used as input, with a corresponding known metric (e.g., power consumption or a path delay value) used as the ground-truth. Based on the difference between the prediction and the ground-truth, the parameter(s) of the predictive model 435 can be updated (e.g., using backpropagation) stochastically and/or in batches.

As discussed above, the prediction 440 may generally correspond to a netlist prediction or design prediction (e.g., a path delay prediction or other timing prediction). As discussed above, because this prediction is generated based in part on the improved functional embeddings, the prediction may be more accurate and reliable as compared to some conventional approaches. This enables substantially improved evaluation of netlist designs using machine learning.

Example Method for Generating Netlist Predictions Using Machine Learning

Figure 5:
FIG. 5 is a flow diagram depicting an example method for generating netlist predictions using machine learning.
Figure 5:
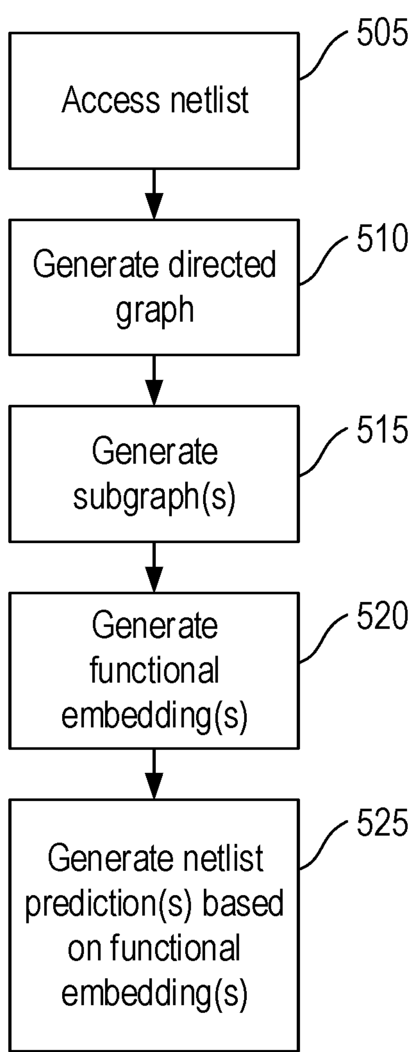

FIG. 5 is a flow diagram depicting an example method 500 for generating netlist predictions using machine learning. In some aspects, the method 500 is performed by a machine learning system comprising one or more components, such as a conversion component (e.g., the conversion component 120 of FIG. 1) and/or a prediction component (e.g., the prediction component 130 of FIG. 1). In some aspects, the prediction component may itself include additional components, such as an extraction component (e.g., the extraction component 219 of FIG. 2), a connectivity component (e.g., the connectivity component 225 of FIG. 2), an encoder component (e.g., the encoder 310 of FIG. 3), a graph component (e.g., the graph model 405 of FIG. 4), aggregator components (e.g., the aggregators 415 and 425 of FIG. 4), and/or predictive models (e.g., the predictive model 435 of FIG. 4). In some aspects, if the machine learning system is also used to train one or more models, the system may further include training components (e.g., the loss component 320 of FIG. 3). In other aspects, the model(s) may be trained on one system (e.g., a training system) and used for inferencing on other systems.

At block 505, the machine learning system accesses a netlist design (e.g., the netlist 102 of FIG. 1). As discussed above, the netlist design may generally specify an arrangement of electronic components (e.g., combinational gates and registers), as well as the connectivity between such components, for all or part of a circuit (e.g., for a printed circuit board (PCB), an IC, a SoC, and the like).

At block 510, the machine learning system generates a DG (e.g., the graph representation 122 of FIG. 1) based on the netlist. For example, as discussed above, the machine learning system may generate a node for each electronic component in the netlist, and the machine learning system may add directed edges among the nodes based on the wiring of the netlist. In some aspects, the machine learning system may additionally associate each node with component-level information, such as identifying the type of the component.

At block 515, the machine learning system generates or extracts one or more subgraphs (e.g., subgraphs 222A and/or 222B of FIG. 2), which may be DAGs or DGs, based on the netlist DG. For example, in some aspects, the machine learning system may identify all nodes corresponding to registers (or other similar components, such as memory accesses, I/O components, and the like). In some aspects, for each given node that receives input from one or more other components in the netlist, the machine learning system can determine or identify the connectivity cone of the node. For example, the machine learning system may identify the set of components/paths, beginning with one or more input registers (or other components such as memory or I/Os) and passing through one or more intermediate components (e.g., combinational gates) to generate input to the given node. A non-limiting example method for generating the DAG(s) (or DGs) is discussed in more detail below with reference to FIG. 6.

At block 520, the machine learning system generates functional embeddings (e.g., the functional embedding 315 of FIG. 3) for the extracted DAGs (or DGs). That is, the machine learning system may process each DAG (or DG) using an encoder model (such as the encoder 310 of FIG. 3) to generate a corresponding embedding, where the encoder was trained based at least in part on the functionality of the circuits (e.g., using contrastive learning).

At block 525, the machine learning system generates one or more netlist predictions (e.g., the prediction 440 of FIG. 4) based on the functional embeddings. Generally, the particular techniques used to generate the predictions, as well as the contents of such predictions, may vary depending on the particular implementation. For example, the machine learning system may process each DAG (or DG) (generated at block 515) with a graph model to generate a DAG (or DG) embedding, combine the DAG (or DG) embedding with the corresponding functional embedding (generated at block 510), and process this aggregated embedding with a classifier or prediction model to generate the netlist prediction(s).

In some aspects, the machine learning system generates one or more predictions for each DAG (or DG). In some aspects, the machine learning system can additionally or alternatively generate netlist-wide predictions, such as by aggregating the DAG-level (or DG-level) predictions (e.g., summing the predicted path delays across the DAGs).

Example Method for Generating DAGs Based on Netlist Designs

Figure 6:
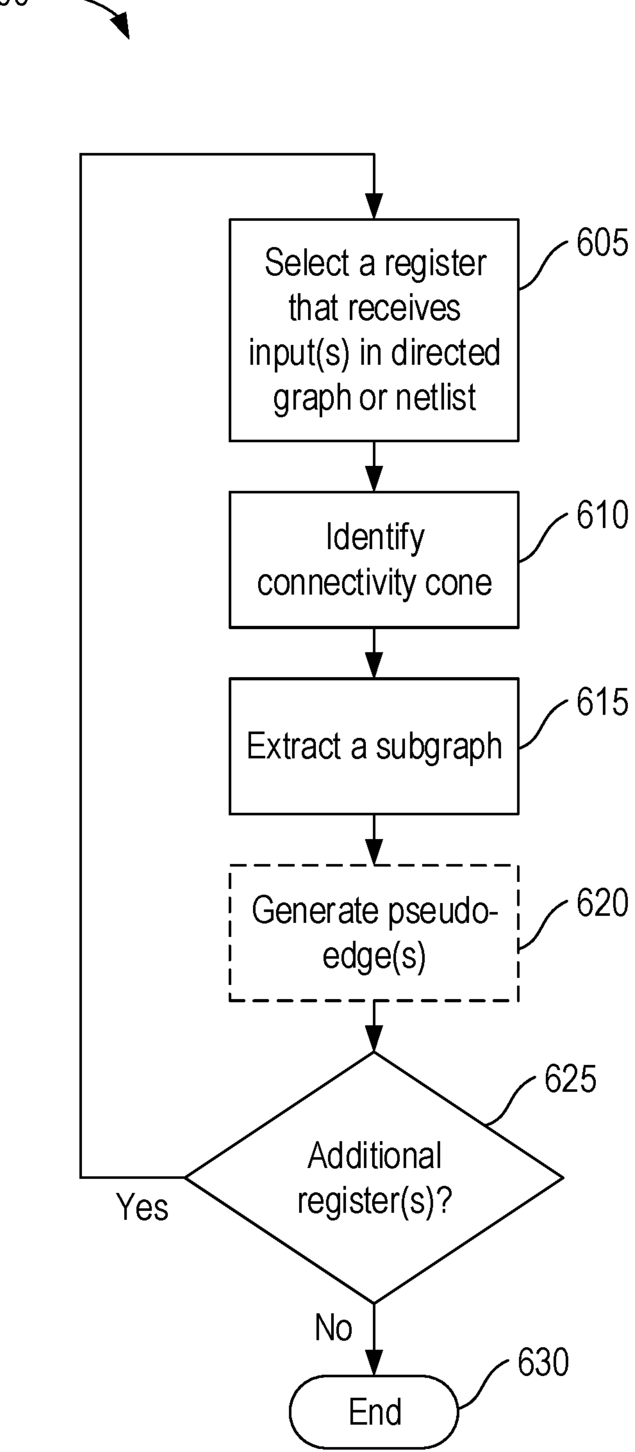
FIG. 6 is a flow diagram depicting an example method for generating DGs based on netlist designs.

FIG. 6 is a flow diagram depicting an example method 600 for generating DAGs (or DGs) based on netlist designs. In some aspects, the method 600 is performed by a machine learning system, such as the machine learning system that performs the method 500 of FIG. 5. In at least one aspect, the method 600 provides additional detail for block 515 of FIG. 5.

At block 605, the machine learning system selects a register in a netlist (or a node in a DG) that receives one or more inputs from one or more upstream components in the netlist or DG. For example, as discussed above, the machine learning system may select node 215, 220, and/or 218 in FIG. 2. In some aspects, the machine learning system may select from among all nodes that correspond to registers, and the machine learning system determine whether the selected node receives input from other component(s) before proceeding. Generally, the machine learning system may select the register in any suitable way, as all such register nodes will be evaluated during the method 600. Though a sequential method (selecting and evaluating each node in turn) is depicted for conceptual clarity, in some aspects, the machine learning system may evaluate some or all in parallel. Additionally, though the illustrated example depicts selecting a register node, in some aspects, the machine learning system may similarly select other components that act as sources or sinks for data in a netlist, such as memory accesses, I/O operations, and the like.

At block 610, the machine learning system identifies the connectivity cone of the selected register or node. For example, as discussed above, the machine learning system may identify the edge(s) entering the selected node, and the machine learning system may traverse each such edge to the preceding node (where each edge originates). If any of these nodes are register nodes, the machine learning system may add them to a set of input registers and cease further backtracking from these nodes. For any nodes that are not registers (e.g., combinational nodes), the machine learning system may again identify the edge(s) entering each such node, and again traverse each such edge backwards to the preceding nodes. This process repeats until all register-to-register paths terminating at the selected node have been identified. These components (and corresponding edges) form the connectivity cone of the node.

At block 615, the machine learning system extracts a subgraph (e.g., a DAG or DG) from the netlist DG based on the connectivity cone. For example, as discussed above, the machine learning system may extract or generate a DAG that begins with one or more input nodes (e.g., input registers) and terminates at the selected register node.

At block 620, the machine learning system optionally generates or adds pseudo-edges to the subgraph. For example, as discussed above, the machine learning system may identify any node(s) in the subgraph that lack a direct edge connection to the selected register node, and the machine learning system may add a pseudo-edge to each such node to connect this node directly to the register node. This can improve learning effective embeddings, as discussed above.

At block 625, the machine learning system determines whether there is at least one additional register node that has not been evaluated. If so, the method 600 returns to block 605, such that every component in the DG is included in at least one subgraph. If no additional registers remain, the method 600 terminates at block 630.

Figure 7:
FIG. 7 is a flow diagram depicting an example method for generating netlist predictions based on functional embeddings.
Figure 7:
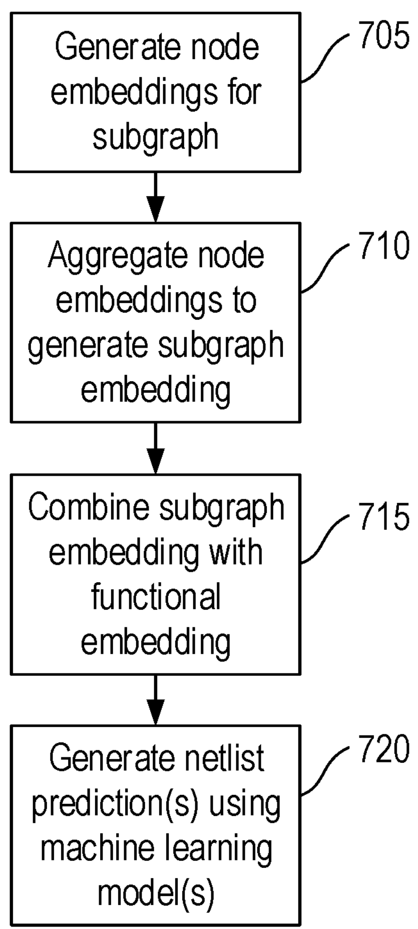

Example Method for Generating Netlist Predictions Based on Functional Embeddings FIG. 7 is a flow diagram depicting an example method 700 for generating netlist predictions based on functional embeddings. In some aspects, the method 700 is performed by a machine learning system, such as the machine learning system that performs the method 500 of FIG. 5 and/or the method 600 of FIG. 6. In at least one aspect, the method 700 provides additional detail for block 525 of FIG. 5.

At block 705, the machine learning system generates node embeddings (e.g., node embeddings 410 of FIG. 4) for a subgraph (e.g., a DAG or DG). That is, the machine learning system generates a respective node embedding for each node in the subgraph. For example, as discussed above, the machine learning system may process the subgraph using a graph model (e.g., a GNN) to generate node embeddings.

At block 710, the machine learning system aggregates the node embeddings to generate a subgraph embedding (e.g., the DAG embedding 420 of FIG. 4). For example, as discussed above, the machine learning system may use max-pooling, mean-pooling, min-pooling, and the like to combine or aggregate the node embeddings into a single subgraph embedding.

At block 715, the machine learning system combines the subgraph embedding with a functional embedding for the subgraph. For example, as discussed above, the machine learning system may concatenate the subgraph embedding with the functional embedding.

At block 720, the machine learning system generates one or more netlist predictions by processing the aggregated embedding (generated at block 715) with one or more trained machine learning models, as discussed above.

Example Method for Training a Functional Encoder

Figure 8:
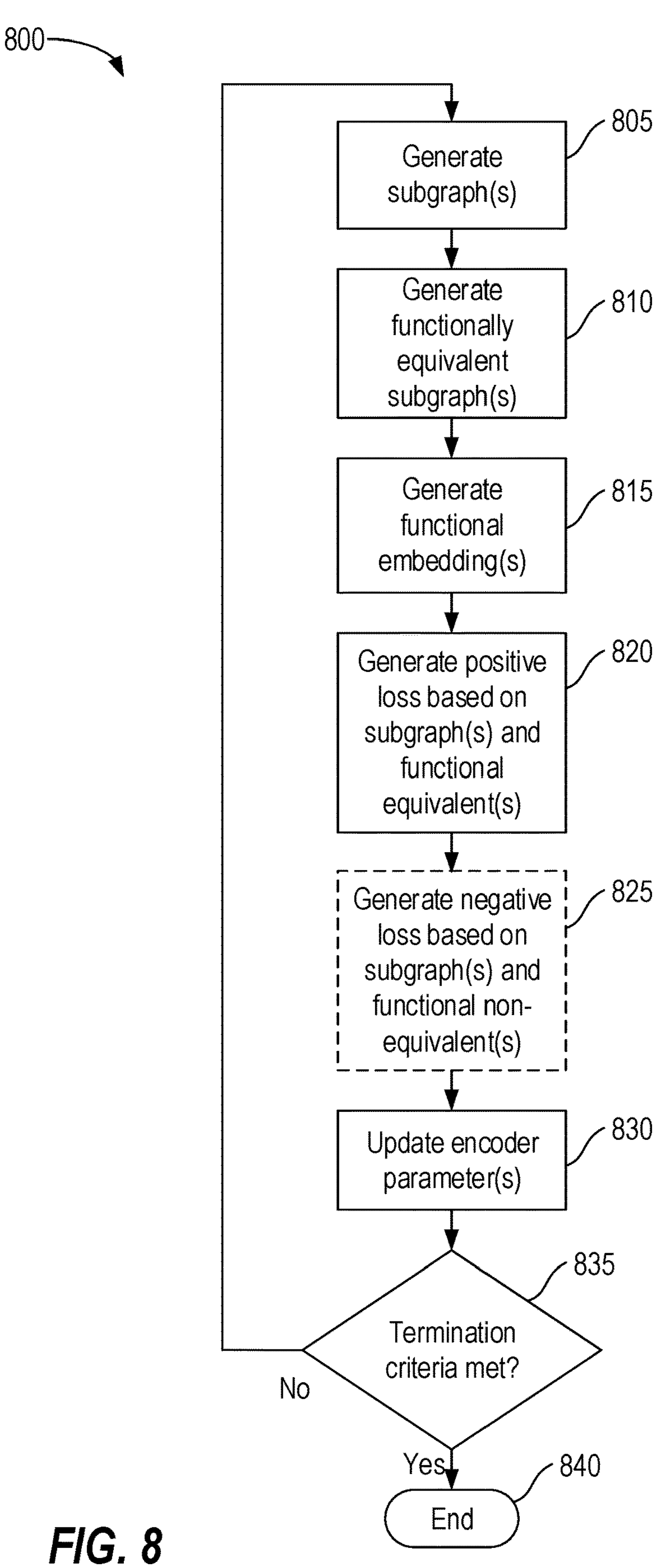
FIG. 8 is a flow diagram depicting an example method for training a functional encoder.

FIG. 8 is a flow diagram depicting an example method 800 for training a functional encoder. In some aspects, the method 800 is performed by a machine learning system, such as the machine learning system that performs the method 500 of FIG. 5, the method 600 of FIG. 6, and/or the method 700 of FIG. 7. In some aspects, the method 800 (to train the encoder) may be performed by a discrete system (e.g., a dedicated training system).

At block 805, the machine learning system generates one or more subgraphs (e.g., DAGs such as DAG 305 of FIG. 3 and/or DGs) based on one or more netlists (e.g., based on DGs from one or more netlists), as discussed above. For example, the machine learning system may extract subgraphs from the DG based on the connectivity cone of each register.

At block 810, the machine learning system generates one or more functionally equivalent subgraphs (e.g., DAGs or DGs) for the subgraph(s) generated at block 805. For example, as discussed above, the machine learning system may use one or more synthesis tools, which can be used to automatically generate logically equivalent netlists in an effort to find a more efficient or improved design that is functionally equivalent, to generate functionally equivalent subgraph(s) for each subgraph that was generated or extracted from a DG. As discussed above, these sets of two or more functionally equivalent subgraphs can act as positive exemplars during training.

At block 815, the machine learning system generates a functional embedding (e.g., one of the functional embeddings 315 of FIG. 3) for each subgraph (including subgraph(s) generated at block 805, as well as subgraph(s) generated at block 810). For example, as discussed above, the machine learning system may process each DAG using an encoder model, such as the encoder 310 of FIG. 3.

At block 820, the machine learning system then generates one or more positive loss terms based on the subgraph(s) (generated at block 805) and their functional equivalents (generated at block 810). That is, the machine learning system may compute a loss based on a similarity metric (such as cosine similarity) between each subgraph and its functional equivalent(s), where high similarity (low distance) results in low loss value. In some aspects, the machine learning system may use one or more regularization terms to prevent or reduce overfitting.

At block 825, the machine learning system optionally generates one or more negative loss terms based on the subgraph(s) (generated at block 805) and functional non-equivalents. That is, the machine learning system may compute a loss based on a similarity metric (such as cosine similarity) between each subgraph and one or more non-equivalent subgraphs, where high similarity (low distance) results in high loss values.

At block 830, the machine learning system updates one or more parameters of the encoder model (e.g., encoder parameters) based on the positive loss term(s) and/or negative loss term(s). In some aspects, as discussed above, the machine learning system may use backpropagation, such as via stochastic gradient descent (e.g., updating the parameters discretely for each training pair), batch gradient descent, and the like.

At block 835, the machine learning system determines whether one or more termination criteria have been met (e.g., whether the training batch or epoch that was completed at block 830 should also complete the training). Generally, the machine learning system may use a variety of techniques to determine whether the termination criteria are met, such as determining whether a defined accuracy has been reached, determining whether a defined amount of time or resources have been spent training, and the like.

If, at block 835, the machine learning system determines that the criteria are not met, the method 800 returns to block 805 to begin a new round or batch. If, at block 835, the machine learning system determines that the termination criteria are met, the method 800 terminates at block 840.

Figure 9:
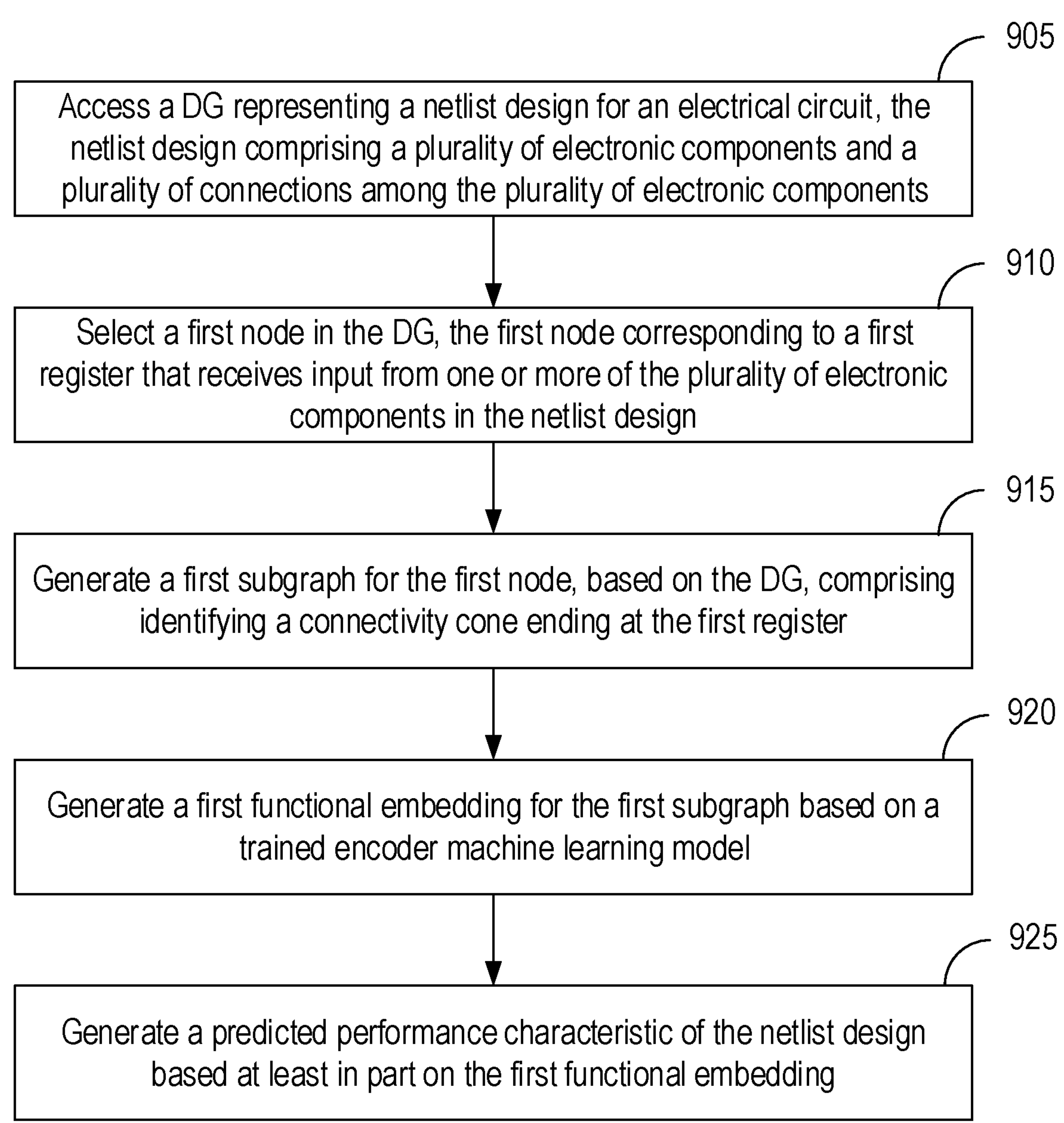
FIG. 9 is a flow diagram depicting an example method for generating predicted performance characteristics for netlist designs.

Example Method for Generating Predicted Performance Characteristics for Netlist Designs FIG. 9 is a flow diagram depicting an example method 900 for generating predicted performance characteristics for netlist designs. In some aspects, the method 900 is performed by a machine learning system, such as the machine learning system that performs the method 500 of FIG. 5, the machine learning system that performs the method 600 of FIG. 6, the method 700 of FIG. 7, the method 800 of FIG. 8, and/or the method 800 of FIG. 8.

At block 905, a DG representing a netlist design for an electrical circuit is accessed, the netlist design comprising a plurality of electronic components and a plurality of connections among the plurality of electronic components.

At block 910, a first node in the DG is selected, the first node corresponding to a first register that receives input from one or more of the plurality of electronic components in the netlist design.

At block 915, a first subgraph is generated for the first node, based on the DG, comprising identifying a connectivity cone ending at the first register.

In some aspects, the first subgraph comprises a set of nodes comprising: the first subgraph comprises a set of nodes comprising: one or more input nodes, each respective input node of the one or more input nodes corresponding to a respective preceding register in the netlist design having an output coupled to an input of the first register, and one or more intermediate nodes corresponding to combinational components in the netlist design.

At block 920, a first functional embedding for the first subgraph is generated based on a trained encoder machine learning model.

In some aspects, the method 900 further includes generating a plurality of pseudo-edges connecting one or more nodes in the set of nodes, which otherwise lack a direct connection to the first node, to the first node, wherein generating the first functional embedding comprises processing the first subgraph and the plurality of pseudo-edges using the trained encoder machine learning model.

In some aspects, the trained encoder machine learning model is trained based on a set of positive exemplars, each positive exemplar corresponding to a plurality of subgraphs having equivalent netlist functionality.

In some aspects, each respective positive exemplar of the set of positive exemplars is generated by processing a respective subgraph using a synthesis tool to generate one or more functionally equivalent subgraphs.

In some aspects, the trained encoder machine learning model is trained based further on a set of negative exemplars, each negative exemplar corresponding to a plurality of subgraphs having non-equivalent netlist functionality.

At block 925, a predicted performance characteristic of the netlist design is generated based at least in part on the first functional embedding.

In some aspects, generating the predicted performance characteristic comprises: generating a subgraph embedding based on the first subgraph, aggregating the subgraph embedding and the first functional embedding to generate an aggregated embedding, and processing the aggregated embedding using a trained machine learning model to generate the predicted performance characteristic.

In some aspects, generating the subgraph embedding comprises: processing the first subgraph using a graph machine learning model to generate a respective node embedding for each respective node in the first subgraph, and aggregating the respective node embeddings to generate the subgraph embedding.

In some aspects, the method 900 further includes processing a plurality of prediction-related features, along with the first subgraph, using the graph machine learning model to generate the respective node embeddings, wherein the prediction-related features are selected based on the predicted performance characteristic.

In some aspects, the method 900 further includes generating a plurality of subgraphs based on the DG, and generating a respective functional embedding for each respective subgraph of the plurality of subgraphs based on the trained encoder machine learning model, wherein the predicted performance characteristic of the netlist design is generated based further on the respective functional embedding for each respective subgraph of the plurality of subgraphs.

In some aspects, the predicted performance characteristic of the netlist design comprises at least one of a performance metric, a power metric, or an area metric for the netlist design.

Figure 10:
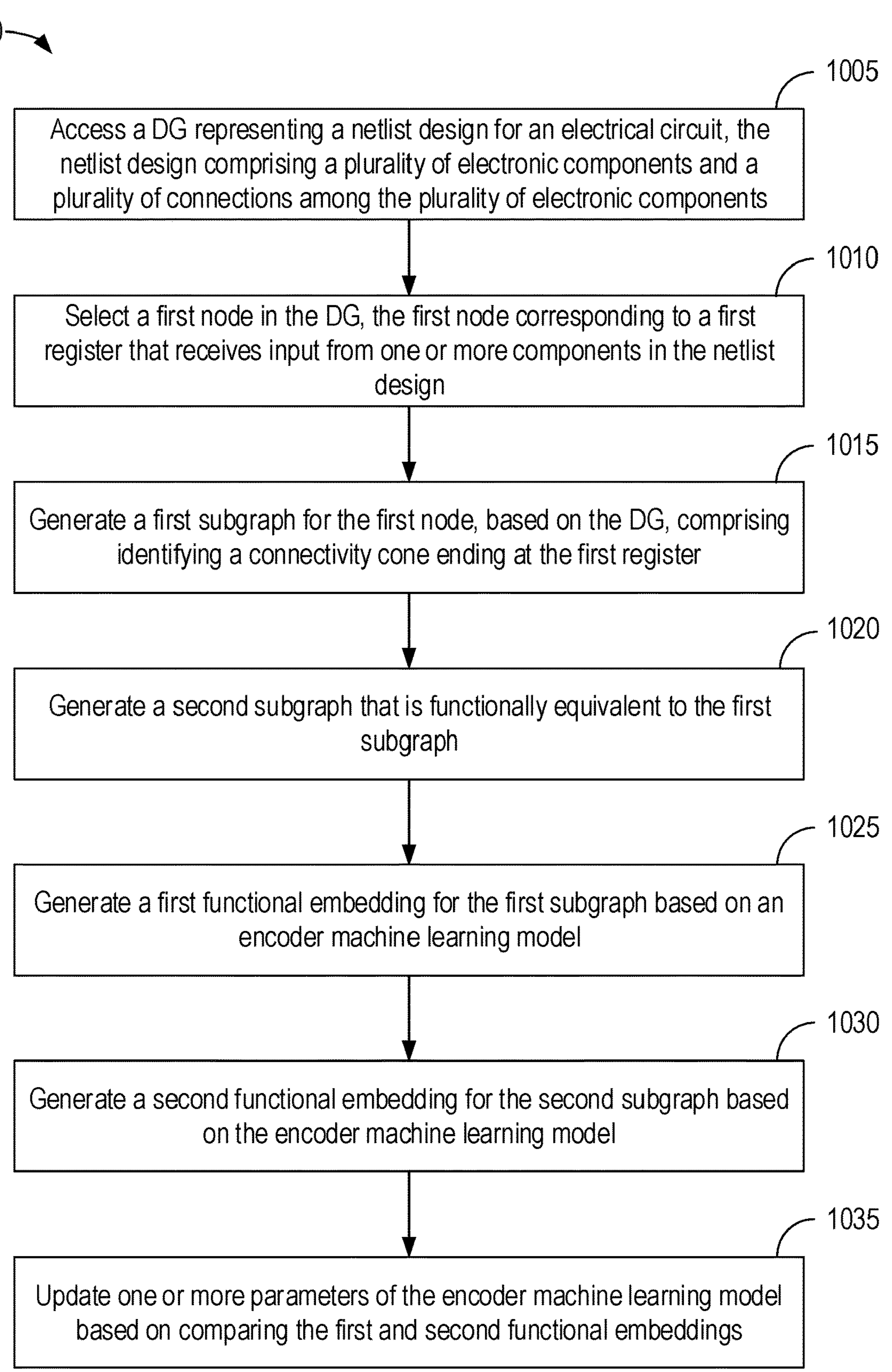
FIG. 10 is a flow diagram depicting an example method for training a machine learning model to generate functional netlist embeddings.

Example Method for Training a Machine Learning Model to Generate Functional Netlist Embeddings FIG. 10 is a flow diagram depicting an example method 1000 for training a machine learning model to generate functional netlist embeddings. In some aspects, the method 900 is performed by a machine learning system, such as the machine learning system that performs the method 500 of FIG. 5, the method 600 of FIG. 6, the method 700 of FIG. 7, the method 800 of FIG. 8, and/or the method 900 of FIG. 9.

At block 1005, a DG representing a netlist design for an electrical circuit is accessed, the netlist design comprising a plurality of electronic components and a plurality of connections among the plurality of electronic components.

At block 1010, a first node in the DG is selected, the first node corresponding to a first register that receives input from one or more components in the netlist design.

At block 1015, a first subgraph is generated for the first node, based on the DG, comprising identifying a connectivity cone ending at the first register.

In some aspects, the first subgraph comprises a set of nodes comprising: the first node, one or more input nodes, each respective input node of the one or more input nodes corresponding to a respective preceding register in the netlist design having an output coupled to an input of the first register, and one or more intermediate nodes corresponding to combinational components in the netlist design.

At block 1020, a second subgraph that is functionally equivalent to the first subgraph is generated.

At block 1025, a first functional embedding for the first subgraph is generated based on an encoder machine learning model.

At block 1030, a second functional embedding for the second subgraph is generated based on the encoder machine learning model.

In some aspects, the method 900 further include generating a plurality of pseudo-edges connecting one or more nodes in the set of nodes, which otherwise lack a direct connection to the first node, to the first node, wherein generating the first functional embedding comprises processing the first subgraph and the plurality of pseudo-edges using the trained encoder machine learning model.

At block 1035, one or more parameters of the encoder machine learning model are updated based on comparing the first and second functional embeddings.

In some aspects, the method 1000 further includes generating a plurality of subgraphs based on the DG, and generating a respective functional embedding for each respective subgraph of the plurality of subgraphs based on the trained encoder machine learning model.

In some aspects, the method 1000 further includes training the encoder machine learning model based on a set of positive exemplars, each positive exemplar corresponding to a plurality of subgraphs having equivalent netlist functionality.

In some aspects, each respective positive exemplar of the set of positive exemplars is generated by processing a respective subgraph using a synthesis tool to generate one or more functionally equivalent subgraphs.

In some aspects, the method 1000 further includes training the encoder machine learning model based further on a set of negative exemplars, each negative exemplar corresponding to a plurality of subgraphs having non-equivalent netlist functionality.

Example Processing System for Netlist Evaluation

Figure 11:
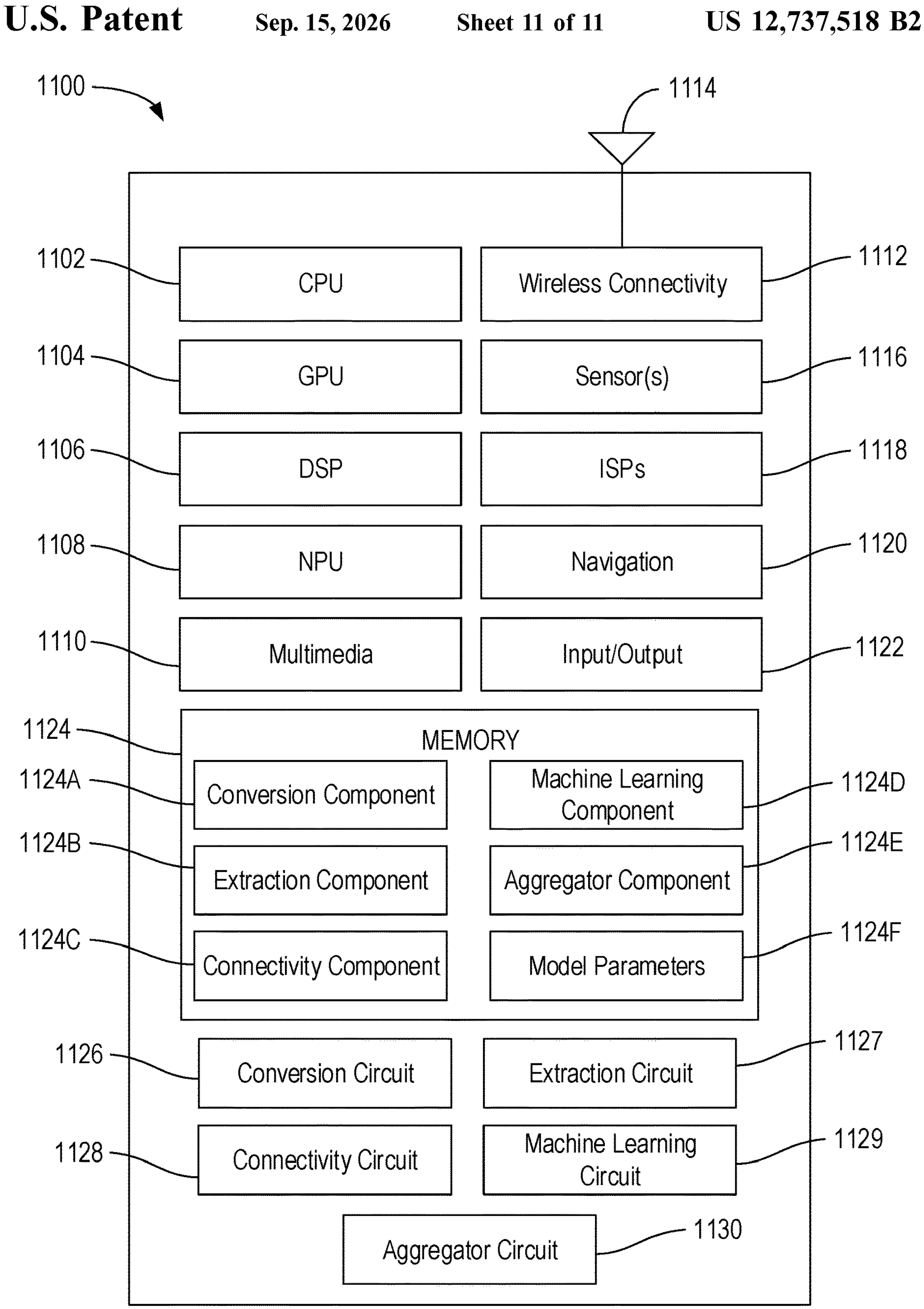
FIG. 11 depicts an example processing system configured to perform various aspects of the present disclosure.

In some aspects, the workflows, techniques, and methods described with reference to FIGS. 1-10 may be implemented on one or more devices or systems. FIG. 11 depicts an example processing system 1100 configured to perform various aspects of the present disclosure, including, for example, the techniques and methods described with respect to FIGS. 1-10. In some aspects, the processing system 1100 may correspond to a machine learning system, such as the machine learning system that implements the method 500 of FIG. 5 and/or the machine learning system that implements the method 800 of FIG. 8. For example, the processing system 1100 may correspond to a machine learning system that trains encoders and/or predictive models, and/or that uses encoders and/or predictive models during runtime. Although depicted as a single system for conceptual clarity, in some aspects, as discussed above, the operations described below with respect to the processing system 1100 may be distributed across any number of devices or systems.

The processing system 1100 includes a central processing unit (CPU) 1102, which in some examples may be a multi-core CPU. Instructions executed at the CPU 1102 may be loaded, for example, from a program memory associated with the CPU 1102 or may be loaded from a memory partition (e.g., a partition of memory 1124).

The processing system 1100 also includes additional processing components tailored to specific functions, such as a graphics processing unit (GPU) 1104, a digital signal processor (DSP) 1106, a neural processing unit (NPU) 1108, a multimedia component 1110 (e.g., a multimedia processing unit), and a wireless connectivity component 1112.

An NPU, such as NPU 1108, is generally a specialized circuit configured for implementing the control and arithmetic logic for executing machine learning algorithms, such as algorithms for processing artificial neural networks (ANNs), deep neural networks (DNNs), random forests (RFs), and the like. An NPU may sometimes alternatively be referred to as a neural signal processor (NSP), tensor processing unit (TPU), neural network processor (NNP), intelligence processing unit (IPU), vision processing unit (VPU), or graph processing unit.

NPUs, such as the NPU 1108, are configured to accelerate the performance of common machine learning tasks, such as image classification, machine translation, object detection, and various other predictive models. In some examples, a plurality of NPUs may be instantiated on a single chip, such as a system on a chip (SoC), while in other examples the NPUs may be part of a dedicated neural-network accelerator.

NPUs may be optimized for training or inference, or in some cases configured to balance performance between both. For NPUs that are capable of performing both training and inference, the two tasks may still generally be performed independently.

NPUs designed to accelerate training are generally configured to accelerate the optimization of new models, which is a highly compute-intensive operation that involves inputting an existing dataset (often labeled or tagged), iterating over the dataset, and then adjusting model parameters, such as weights and biases, in order to improve model performance. Generally, optimizing based on a wrong prediction involves propagating back through the layers of the model and determining gradients to reduce the prediction error.

NPUs designed to accelerate inference are generally configured to operate on complete models. Such NPUs may thus be configured to input a new piece of data and rapidly process this piece of data through an already trained model to generate a model output (e.g., an inference).

In some implementations, the NPU 1108 is a part of one or more of the CPU 1102, the GPU 1104, and/or the DSP 1106.

In some examples, the wireless connectivity component 1112 may include subcomponents, for example, for third generation (3G) connectivity, fourth generation (4G) connectivity (e.g., 4G LTE), fifth generation connectivity (e.g., 5G or NR), Wi-Fi connectivity, Bluetooth connectivity, and/or other wireless data transmission standards. The wireless connectivity component 1112 is further coupled to one or more antennas 1114.

The processing system 1100 may also include one or more sensor processing units 1116 associated with any manner of sensor, one or more image signal processors (ISPs) 1118 associated with any manner of image sensor, and/or a navigation processor 1120, which may include satellite-based positioning system components (e.g., GPS or GLONASS), as well as inertial positioning system components.

The processing system 1100 may also include one or more input and/or output devices 1122, such as screens, touch-sensitive surfaces (including touch-sensitive displays), physical buttons, speakers, microphones, and the like.

In some examples, one or more of the processors of the processing system 1100 may be based on an ARM or RISC-V instruction set.

The processing system 1100 also includes the memory 1124, which is representative of one or more static and/or dynamic memories, such as a dynamic random access memory, a flash-based static memory, and the like. In this example, the memory 1124 includes computer-executable components, which may be executed by one or more of the aforementioned processors of the processing system 1100.

In particular, in this example, the memory 1124 includes a conversion component 1124A, an extraction component 1124B, a connectivity component 1124C, a machine learning component 1124D, and an aggregator component 1124E. The memory 1124 further includes model parameters 1124F for one or more models (e.g., the encoder 310 of FIG. 3, the graph model 405 of FIG. 4, and/or the predictive model 435 of FIG. 4). Although not included in the illustrated example, in some aspects the memory 1124 may also include other data, such as training data (e.g., netlists, DGs, and/or DAGs). Though depicted as discrete components for conceptual clarity in FIG. 11, the illustrated components (and others not depicted) may be collectively or individually implemented in various aspects.

The processing system 1100 further comprises a conversion circuit 1126, an extraction circuit 1127, a connectivity circuit 1128, a machine learning circuit 1129, and an aggregator circuit 1130. The depicted circuits, and others not depicted, may be configured to perform various aspects of the techniques described herein.

For example, the conversion component 1124A and/or the conversion circuit 1126 (which may correspond to the conversion component 120 of FIG. 1) may be used to convert netlist designs into corresponding graphs (e.g., converting the netlist 102 into the graph representation 122, each of FIG. 2), as discussed above. For example, the conversion component 1124A and/or the conversion circuit 1126 may process input netlists to generate DGs where each node in the graph corresponds to an electronic component in the netlist and each directed edge in the graph corresponds to a wire in the netlist design.

The extraction component 1124B and/or the extraction circuit 1127 (which may correspond to the extraction component 219 of FIG. 2) may be used to extract and/or generate subgraphs or DAGs (e.g., the subgraphs 222 of FIG. 2), as discussed above. For example, the extraction component 1124B and/or the extraction circuit 1127 may generate, for each register node, a corresponding subgraph (e.g., DAG) based on its connectivity cone.

The connectivity component 1124C and/or the connectivity circuit 1128 (which may correspond to the connectivity component 225 of FIG. 2) may be used to generate and insert pseudo-edges into subgraphs (e.g., to generate the subgraph 222B of FIG. 2), as discussed above. For example, the connectivity component 1124C and/or the connectivity circuit 1128 may, for each respective node in the subgraph that lacks a direct edge connection to the endpoint node, insert a respective pseudo-edge to the endpoint.

The machine learning component 1124D and/or the machine learning circuit 1129 (which may correspond to the prediction component 130 of FIG. 1, the encoder 310 of FIG. 3, the loss component 320 of FIG. 3, the graph model 405 of FIG. 4, and/or the predictive model 435 of FIG. 4) may be used to train and/or use machine learning models to generate functional embeddings and/or netlist predictions, as discussed above. For example, the machine learning component 1124D and/or the machine learning circuit 1129 may process subgraphs (e.g., DAGs) to generate subgraph or DAG embeddings using a first model, process subgraphs (e.g., DAGs) to generate functional embeddings using a second model, and/or process the aggregated subgraph or DAG embeddings and functional embeddings to generate netlist predictions, as discussed above.

The aggregator component 1124E and/or the aggregator circuit 1130 (which may correspond to the aggregator 415 of FIG. 4 and/or the aggregator 425 of FIG. 4) may be used to aggregate input embeddings, as discussed above. For example, the aggregator component 1124E and/or the aggregator circuit 1130 may aggregate node embeddings to generate subgraph-level embeddings (e.g., DAG-level embeddings), aggregate subgraph embeddings and functional embeddings to generate aggregated embeddings, and the like.

Though depicted as separate components and circuits for clarity in FIG. 11, the conversion circuit 1126, the extraction circuit 1127, the connectivity circuit 1128, the machine learning circuit 1129, and the aggregator circuit 1130 may collectively or individually be implemented in other processing devices of the processing system 1100, such as within the CPU 1102, the GPU 1104, the DSP 1106, the NPU 1108, and the like.

Generally, the processing system 1100 and/or components thereof may be configured to perform the methods described herein.

Notably, in other aspects, elements of the processing system 1100 may be omitted, such as where the processing system 1100 is a server computer or the like. For example, the multimedia component 1110, the wireless connectivity component 1112, the sensor processing units 1116, the ISPs 1118, and/or the navigation processor 1120 may be omitted in other aspects. Further, aspects of the processing system 1100 may be distributed between multiple devices.

EXAMPLE CLAUSES

Implementation examples are described in the following numbered clauses:

Clause 1: A method, comprising: accessing a directed graph (DG) representing a netlist design for an electrical circuit, the netlist design comprising a plurality of electronic components and a plurality of connections among the plurality of electronic components; selecting a first node in the DG, the first node corresponding to a first register that receives input from one or more of the plurality of electronic components in the netlist design; generating a first subgraph for the first node, based on the DG, comprising identifying a connectivity cone ending at the first register; generating a first functional embedding for the first subgraph based on a trained encoder machine learning model; and generating a predicted performance characteristic of the netlist design based at least in part on the first functional embedding.

Clause 2: A method according to Clause 1, wherein the first subgraph comprises a set of nodes comprising: the first node, one or more input nodes, each respective input node of the one or more input nodes corresponding to a respective preceding register in the netlist design having an output coupled to an input of the first register, and one or more intermediate nodes corresponding to combinational components in the netlist design.

Clause 3: A method according to Clause 2, further comprising generating a plurality of pseudo-edges connecting one or more nodes in the set of nodes, which otherwise lack a direct connection to the first node, to the first node, wherein generating the first functional embedding comprises processing the first subgraph and the plurality of pseudo-edges using the trained encoder machine learning model.

Clause 4: A method according to any of Clauses 1-3, wherein generating the predicted performance characteristic comprises: generating a subgraph embedding based on the first subgraph; aggregating the subgraph embedding and the first functional embedding to generate an aggregated embedding; and processing the aggregated embedding using a trained machine learning model to generate the predicted performance characteristic.

Clause 5: A method according to Clause 4, wherein generating the subgraph embedding comprises: processing the first subgraph using a graph machine learning model to generate a respective node embedding for each respective node in the first subgraph; and aggregating the respective node embeddings to generate the subgraph embedding.

Clause 6: A method according to Clause 5, further comprising processing a plurality of prediction-related features, along with the first subgraph, using the graph machine learning model to generate the respective node embeddings, wherein the prediction-related features are selected based on the predicted performance characteristic.

Clause 7: A method according to Clause 6, further comprising: generating a plurality of subgraphs based on the DG; and generating a respective functional embedding for each respective subgraph of the plurality of subgraphs based on the trained encoder machine learning model, wherein the predicted performance characteristic of the netlist design is generated based further on the respective functional embedding for each respective subgraph of the plurality of subgraphs.

Clause 8: A method according to any of Clauses 1-7, wherein the predicted performance characteristic of the netlist design comprises at least one of a performance metric, a power metric, or an area metric for the netlist design.

Clause 9: A method according to any of Clauses 1-8, wherein the trained encoder machine learning model is trained based on a set of positive exemplars, each positive exemplar corresponding to a plurality of subgraphs having equivalent netlist functionality.

Clause 10: A method according to Clause 9, wherein each respective positive exemplar of the set of positive exemplars is generated by processing a respective subgraph using a synthesis tool to generate one or more functionally equivalent subgraphs.

Clause 11: A method according to any of Clauses 9-10, wherein the trained encoder machine learning model is trained based further on a set of negative exemplars, each negative exemplar corresponding to a plurality of subgraphs having non-equivalent netlist functionality.

Clause 12: A method, comprising: accessing a directed graph (DG) representing a netlist design for an electrical circuit, the netlist design comprising a plurality of electronic components and a plurality of connections among the plurality of electronic components; selecting a first node in the DG, the first node corresponding to a first register that receives input from one or more components in the netlist design; generating a first subgraph for the first node, based on the DG, comprising identifying a connectivity cone ending at the first register; generating a second subgraph that is functionally equivalent to the first subgraph; generating a first functional embedding for the first subgraph based on an encoder machine learning model; generating a second functional embedding for the second subgraph based on the encoder machine learning model; and updating one or more parameters of the encoder machine learning model based on comparing the first and second functional embeddings.

Clause 13: A method according to Clause 12, wherein the first subgraph comprises a set of nodes comprising: the first node, one or more input nodes, each respective input node of the one or more input nodes corresponding to a respective preceding register in the netlist design having an output coupled to an input of the first register, and one or more intermediate nodes corresponding to combinational components in the netlist design.

Clause 14: A method according to Clause 13, further comprising generating a plurality of pseudo-edges connecting one or more nodes in the set of nodes, which otherwise lack a direct connection to the first node, to the first node, wherein generating the first functional embedding comprises processing the first subgraph and the plurality of pseudo-edges using the trained encoder machine learning model.

Clause 15: A method according to any of Clauses 12-14, further comprising: generating a plurality of subgraphs based on the DG; and generating a respective functional embedding for each respective subgraph of the plurality of subgraphs based on the trained encoder machine learning model.

Clause 16: A method according to any of Clauses 12-15, further comprising training the encoder machine learning model based on a set of positive exemplars, each positive exemplar corresponding to a plurality of subgraphs having equivalent netlist functionality.

Clause 17: A method according to Clause 16, wherein each respective positive exemplar of the set of positive exemplars is generated by processing a respective subgraph using a synthesis tool to generate one or more functionally equivalent subgraphs.

Clause 18: A method according to any of Clauses 12-17, further comprising training the encoder machine learning model based further on a set of negative exemplars, each negative exemplar corresponding to a plurality of subgraphs having non-equivalent netlist functionality.

Clause 19: A processing system comprising: a memory comprising computer-executable instructions; and one or more processors configured to execute the computer-executable instructions and cause the processing system to perform a method in accordance with any of Clauses 1-18.

Clause 20: A processing system comprising means for performing a method in accordance with any of Clauses 1-18.

Clause 21: A non-transitory computer-readable medium comprising computer-executable instructions that, when executed by one or more processors of a processing system, cause the processing system to perform a method in accordance with any of Clauses 1-18.

Clause 22: A computer program product embodied on a computer-readable storage medium comprising code for performing a method in accordance with any of Clauses 1-18.

Additional Considerations

The preceding description is provided to enable any person skilled in the art to practice the various aspects described herein. The examples discussed herein are not limiting of the scope, applicability, or aspects set forth in the claims. Various modifications to these aspects will be readily apparent to those skilled in the art, and the generic principles defined herein may be applied to other aspects. For example, changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, the word "exemplary" means "serving as an example, instance, or illustration." Any aspect described herein as "exemplary" is not necessarily to be construed as preferred or advantageous over other aspects.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The following claims are not intended to be limited to the aspects shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112 (f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. A processor-implemented method, comprising:
- accessing a directed graph (DG) representing a netlist design for an electrical circuit, the netlist design comprising a plurality of electronic components and a plurality of connections among the plurality of electronic components;
- selecting a first node in the DG, the first node corresponding to a first register that receives input from one or more of the plurality of electronic components in the netlist design;
- generating a first subgraph for the first node, based on the DG, comprising identifying a connectivity cone ending at the first register;
- generating a first functional embedding for the first subgraph based on a trained encoder machine learning model; and
- generating a predicted performance characteristic of the netlist design based at least in part on the first functional embedding.

2. The processor-implemented method of claim 1, wherein the first subgraph comprises a set of nodes comprising:
- the first node,
- one or more input nodes, each respective input node of the one or more input nodes corresponding to a respective preceding register in the netlist design having an output coupled to an input of the first register, and
- one or more intermediate nodes corresponding to combinational components in the netlist design.

3. The processor-implemented method of claim 2, further comprising generating a plurality of pseudo-edges connecting one or more nodes in the set of nodes, which otherwise lack a direct connection to the first node, to the first node, wherein generating the first functional embedding comprises processing the first subgraph and the plurality of pseudo-edges using the trained encoder machine learning model.

4. The processor-implemented method of claim 1, wherein generating the predicted performance characteristic comprises:
- generating a subgraph embedding based on the first subgraph;
- aggregating the subgraph embedding and the first functional embedding for the first subgraph to generate an aggregated embedding; and
- processing the aggregated embedding using a trained machine learning model to generate the predicted performance characteristic.

5. The processor-implemented method of claim 4, wherein generating the subgraph embedding comprises:
- processing the first subgraph using a graph machine learning model to generate a respective node embedding for each respective node in the first subgraph; and
- aggregating the respective node embeddings to generate the subgraph embedding.

6. The processor-implemented method of claim 5, further comprising processing a plurality of prediction-related features, along with the first subgraph, using the graph machine learning model to generate the respective node embeddings, wherein the prediction-related features are selected based on the predicted performance characteristic.

7. The processor-implemented method of claim 1, further comprising:
- generating a plurality of subgraphs based on the DG; and
- generating a respective functional embedding for each respective subgraph of the plurality of subgraphs based on the trained encoder machine learning model, wherein the predicted performance characteristic of the netlist design is generated based further on the respective functional embedding for each respective subgraph of the plurality of subgraphs.

8. The processor-implemented method of claim 1, wherein the predicted performance characteristic of the netlist design comprises at least one of a performance metric, a power metric, or an area metric for the netlist design.

9. The processor-implemented method of claim 1, wherein the trained encoder machine learning model is trained based on a set of positive exemplars, each positive exemplar corresponding to a plurality of subgraphs having equivalent netlist functionality.

10. The processor-implemented method of claim 9, wherein each respective positive exemplar of the set of positive exemplars is generated by processing a respective subgraph using a synthesis tool to generate one or more functionally equivalent subgraphs.

11. The processor-implemented method of claim 9, wherein the trained encoder machine learning model is trained based further on a set of negative exemplars, each negative exemplar corresponding to a plurality of subgraphs having non-equivalent netlist functionality.

12. A processor-implemented method, comprising:
- accessing a directed graph (DG) representing a netlist design for an electrical circuit, the netlist design comprising a plurality of electronic components and a plurality of connections among the plurality of electronic components;
- selecting a first node in the DG, the first node corresponding to a first register that receives input from one or more components in the netlist design;
- generating a first subgraph for the first node, based on the DG, comprising identifying a connectivity cone ending at the first register;
- generating a second subgraph that is functionally equivalent to the first subgraph;
- generating a first functional embedding for the first subgraph based on an encoder machine learning model;
- generating a second functional embedding for the second subgraph based on the encoder machine learning model; and
- updating one or more parameters of the encoder machine learning model based on comparing the first and second functional embeddings.

13. The processor-implemented method of claim 12, wherein the first subgraph comprises a set of nodes comprising:
- the first node,
- one or more input nodes, each respective input node of the one or more input nodes corresponding to a respective preceding register in the netlist design having an output coupled to an input of the first register, and
- one or more intermediate nodes corresponding to combinational components in the netlist design.

14. The processor-implemented method of claim 13, further comprising generating a plurality of pseudo-edges connecting one or more nodes in the set of nodes, which otherwise lack a direct connection to the first node, to the first node, wherein generating the first functional embedding comprises processing the first subgraph and the plurality of pseudo-edges using the encoder machine learning model.

15. The processor-implemented method of claim 12, further comprising:

generating a plurality of subgraphs based on the DG; and generating a respective functional embedding for each respective subgraph of the plurality of subgraphs based on the encoder machine learning model.

16. The processor-implemented method of claim 12, further comprising training the encoder machine learning model based on a set of positive exemplars, each positive exemplar corresponding to a plurality of subgraphs having equivalent netlist functionality.

17. The processor-implemented method of claim 16, wherein each respective positive exemplar of the set of positive exemplars is generated by processing a respective subgraph using a synthesis tool to generate one or more functionally equivalent subgraphs.

18. The processor-implemented method of claim 12, further comprising training the encoder machine learning model based further on a set of negative exemplars, each negative exemplar corresponding to a plurality of subgraphs having non-equivalent netlist functionality.

19. A processing system comprising:

a memory comprising computer-executable instructions; and one or more processors configured to execute the computer-executable instructions and cause the processing system to perform an operation, comprising:

accessing a directed graph (DG) representing a netlist design for an electrical circuit, the netlist design comprising a plurality of electronic components and a plurality of connections among the plurality of electronic components;

selecting a first node in the DG, the first node corresponding to a first register that receives input from one or more of the plurality of electronic components in the netlist design;

generating a first subgraph for the first node, based on the DG, comprising identifying a connectivity cone ending at the first register;

generating a first functional embedding for the first subgraph based on a trained encoder machine learning model; and generating a predicted performance characteristic of the netlist design based at least in part on the first functional embedding.

20. The processing system of claim 19, wherein the first subgraph comprises a set of nodes comprising:

the first node, one or more input nodes, each respective input node of the one or more input nodes corresponding to a respective preceding register in the netlist design having an output coupled to an input of the first register, and one or more intermediate nodes corresponding to combinational components in the netlist design.

21. The processing system of claim 20, the operation further comprising generating a plurality of pseudo-edges connecting one or more nodes in the set of nodes, which otherwise lack a direct connection to the first node, to the first node, wherein generating the first functional embedding comprises processing the first subgraph and the plurality of pseudo-edges using the trained encoder machine learning model.

22. The processing system of claim 19, wherein generating the predicted performance characteristic comprises:

generating a subgraph embedding based on the first subgraph;

aggregating the subgraph embedding and the first functional embedding for the first subgraph to generate an aggregated embedding; and processing the aggregated embedding using a trained machine learning model to generate the predicted performance characteristic.

23. The processing system of claim 22, wherein generating the subgraph embedding comprises:

processing the first subgraph using a graph machine learning model to generate a respective node embedding for each respective node in the first subgraph; and aggregating the respective node embeddings to generate the subgraph embedding.

24. The processing system of claim 23, further comprising processing a plurality of prediction-related features, along with the first subgraph, using the graph machine learning model to generate the respective node embeddings, wherein the prediction-related features are selected based on the predicted performance characteristic.

25. The processing system of claim 19, the operation further comprising:

generating a plurality of subgraphs based on the DG; and generating a respective functional embedding for each respective subgraph of the plurality of subgraphs based on the trained encoder machine learning model, wherein the predicted performance characteristic of the netlist design is generated based further on the respective functional embedding for each respective subgraph of the plurality of subgraphs.

26. The processing system of claim 19, wherein the predicted performance characteristic of the netlist design comprises at least one of a performance metric, a power metric, or an area metric for the netlist design.

27. The processing system of claim 19, wherein the trained encoder machine learning model is trained based on a set of positive exemplars, each positive exemplar corresponding to a plurality of subgraphs having equivalent netlist functionality.

28. The processing system of claim 27, wherein each respective positive exemplar of the set of positive exemplars is generated by processing a respective subgraph using a synthesis tool to generate one or more functionally equivalent subgraphs.

29. The processing system of claim 27, wherein the trained encoder machine learning model is trained based further on a set of negative exemplars, each negative exemplar corresponding to a plurality of subgraphs having non-equivalent netlist functionality.

30. A processing system, comprising:

means for accessing a directed graph (DG) representing a netlist design for an electrical circuit, the netlist design comprising a plurality of electronic components and a plurality of connections among the plurality of electronic components;

means for selecting a first node in the DG, the first node corresponding to a first register that receives input from one or more of the plurality of electronic components in the netlist design;

means for generating a first subgraph for the first node, based on the DG, comprising identifying a connectivity cone ending at the first register;

means for generating a first functional embedding for the first subgraph based on a trained encoder machine learning model; and means for generating a predicted performance characteristic of the netlist design based at least in part on the first functional embedding.

* * * * *